US 12,278,201 B2

(12) United States Patent
Choi et al.

(10) Patent No.: US 12,278,201 B2
(45) Date of Patent: Apr. 15, 2025

(54) NON-VOLATILE MEMORY DEVICE WITH A CONDUCTIVE ETCH STOP LAYER, METHOD OF MANUFACTURING THE SAME, AND MEMORY SYSTEM INCLUDING THE SAME

(71) Applicant: SAMSUNG ELECTRONICS CO., LTD., Suwon-si (KR)

(72) Inventors: Moorym Choi, Yongin-si (KR); Yunsun Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 17/825,076

(22) Filed: May 26, 2022

(65) Prior Publication Data
US 2023/0117267 A1 Apr. 20, 2023

(30) Foreign Application Priority Data

Oct. 18, 2021 (KR) .......................... 10-2021-0138840

(51) Int. Cl.
*H01L 25/065* (2023.01)
*H01L 23/00* (2006.01)
(Continued)

(52) U.S. Cl.
CPC ............ *H01L 24/08* (2013.01); *H01L 24/80* (2013.01); *H01L 25/0657* (2013.01);
(Continued)

(58) Field of Classification Search
CPC ...... H01L 24/80; H01L 25/0657; H01L 25/18; H01L 2224/08145; H01L 2224/80006;
(Continued)

(56) References Cited

U.S. PATENT DOCUMENTS 8,971,118 B2   3/2015 Jin et al.
9,449,987 B1   9/2016 Miyata et al.
(Continued)

FOREIGN PATENT DOCUMENTS

CN    111180344    5/2020
CN    111971795    11/2020

*Primary Examiner* — Thanh Y. Tran
(74) *Attorney, Agent, or Firm* — F. CHAU & ASSOCIATES, LLC

(57) ABSTRACT

Provided is a non-volatile memory device including a first structure including a first substrate; a peripheral circuit; a first insulation structure; a plurality of first bonding pads; and a first interconnect structure; a second structure, which includes a conductive etch stop layer; a common source line layer; a stacked structure including alternately stacked gate layers and interlayer insulation layers; a plurality of channel structures penetrating through a cell region of the stacked structure; a second insulation structure; a plurality of second bonding pads; and a second interconnect structure and bonded to the first structure; and a connection layer including a third insulation structure; an input/output via; and an input/output pad, wherein an interface between the second insulation structure and the third insulation structure is disposed at a vertical level between the top surface and the bottom surface of the conductive etch stop layer.

20 Claims, 37 Drawing Sheets

(51) Int. Cl.
 *H01L 25/00* (2006.01)
 *H01L 25/18* (2023.01)
(52) U.S. Cl.
 CPC .............. *H01L 25/18* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)
(58) Field of Classification Search
 CPC . H01L 2224/80895; H01L 2224/80896; H01L 2924/1431; H01L 2924/14511; H01L 24/08; H01L 2225/06541; H10B 43/40
 See application file for complete search history.

(56) References Cited

U.S. PATENT DOCUMENTS

| | | | |
|---|---|---|---|
| 10,658,375 | B2 | 5/2020 | Yon et al. |
| 10,685,975 | B2 | 6/2020 | Baek |
| 10,854,632 | B2 | 12/2020 | Kanamori et al. |
| 10,916,556 | B1 | 2/2021 | Sakaibara et al. |
| 10,957,648 | B2 | 3/2021 | Hsu et al. |
| 2019/0326310 | A1 | 10/2019 | Fukuzumi et al. |
| 2020/0194373 | A1 | 6/2020 | Baek et al. |
| 2020/0357784 | A1 | 11/2020 | Park |
| 2022/0005825 | A1 | 1/2022 | Zhang et al. |
| 2022/0208783 | A1* | 6/2022 | Seo ................. H01L 21/823418 |
| 2022/0406801 | A1* | 12/2022 | Kim ................... H01L 27/0207 |

\* cited by examiner

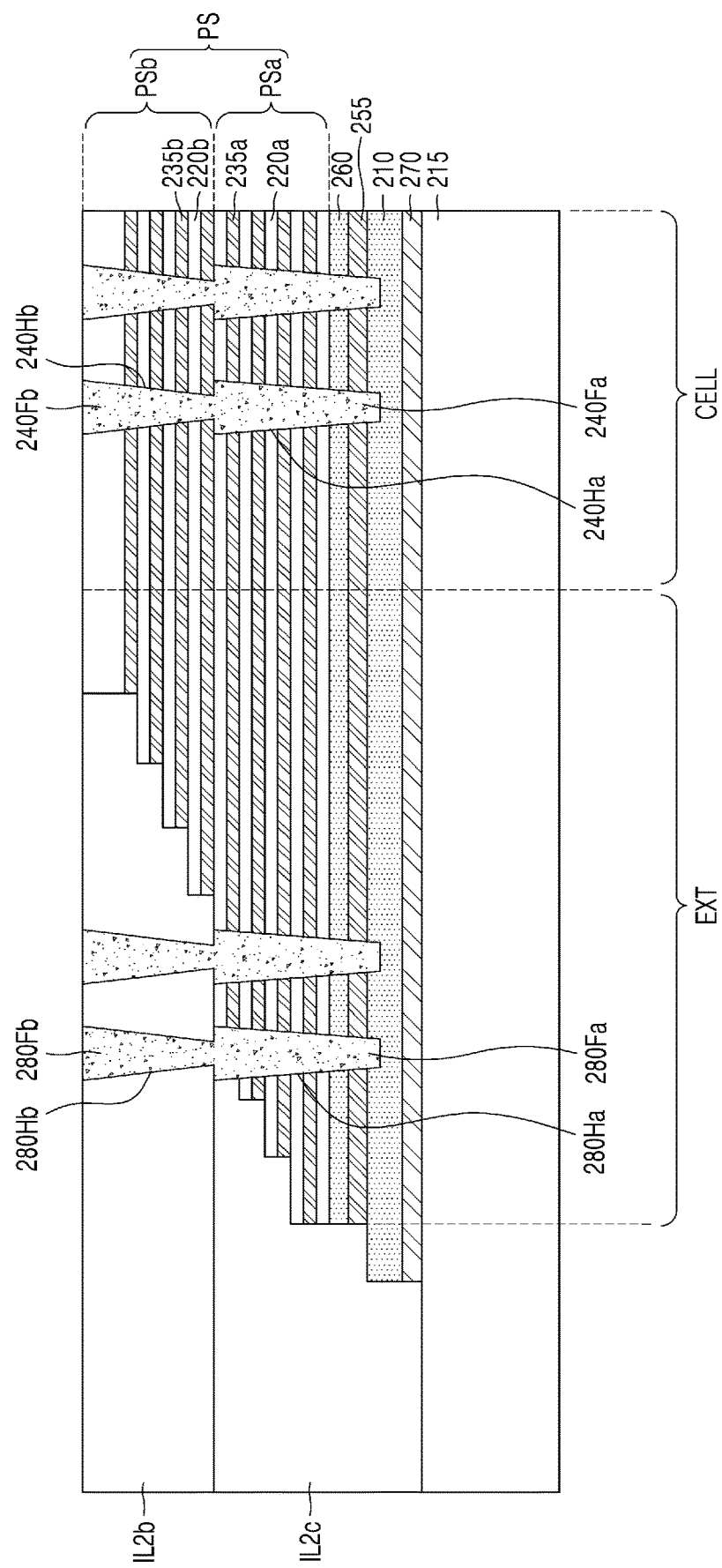

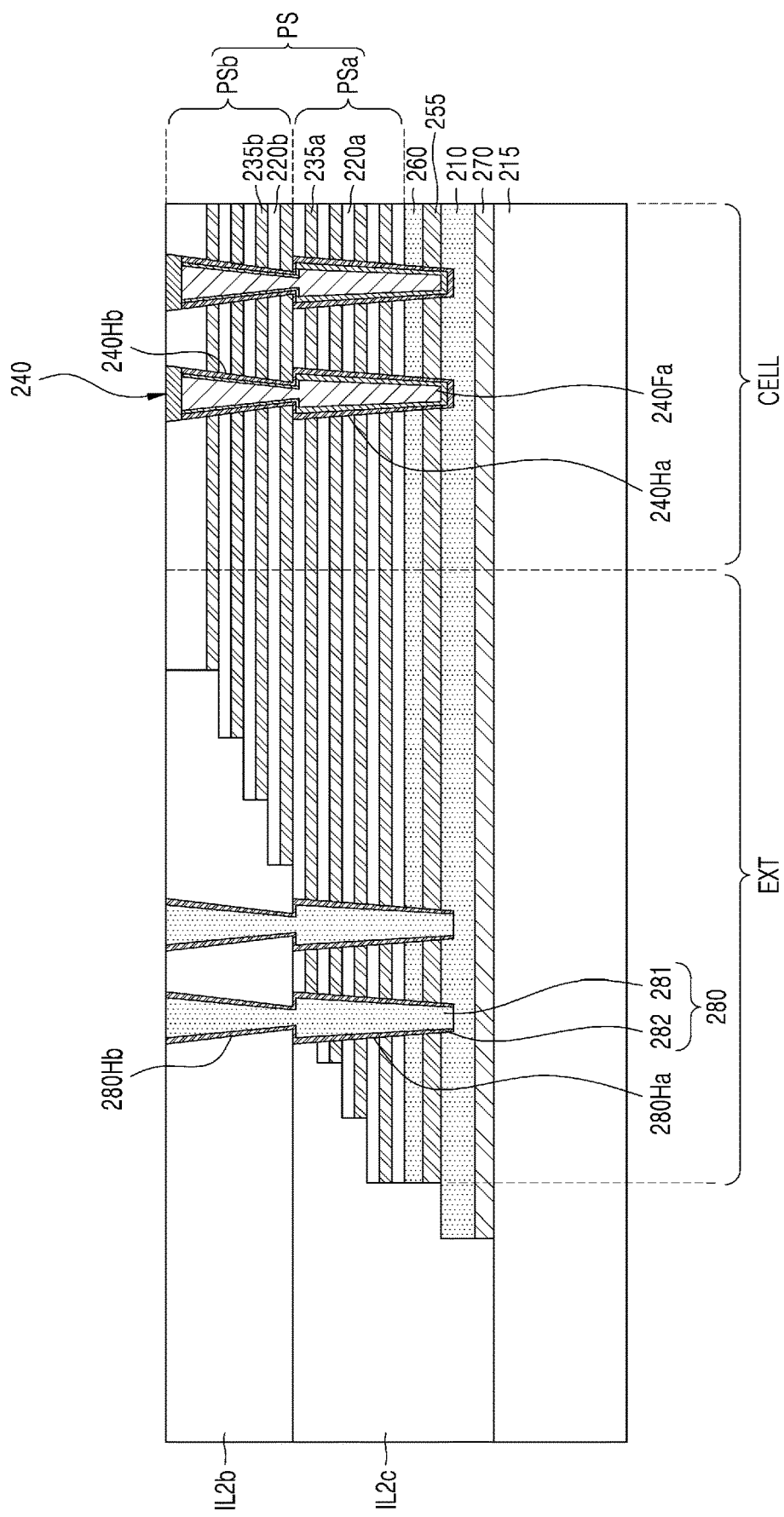

NON-VOLATILE MEMORY DEVICE WITH A CONDUCTIVE ETCH STOP LAYER, METHOD OF MANUFACTURING THE SAME, AND MEMORY SYSTEM INCLUDING THE SAME

CROSS-REFERENCE TO RELATED APPLICATION

This application claims priority under 35 U.S.C. § 119 to Korean Patent Application No. 10-2021-0138840, filed on Oct. 18, 2021, in the Korean Intellectual Property Office, the disclosure of which is incorporated by reference herein in its entirety.

TECHNICAL FIELD

Embodiments of the inventive concept relate to a non-volatile memory device, a method of manufacturing the same, and a memory system including the same, and more particularly, to a 3-dimensional non-volatile memory device including two structures bonded to each other, a method of manufacturing the same, and a memory system including the same.

DISCUSSION OF THE RELATED ART

The demand for electronic devices with high performance and small size has resulted in the development of semiconductor devices with very high integration and space utilization. Many of the semiconductor devices include non-volatile memory devices which must be similarly minimized. To manufacture a non-volatile memory device with a high degree of integration, a 3-dimensional non-volatile memory device in which a plurality of memory cells are arranged in a vertical direction has been proposed.

However, the vertical memory cells have an issue in which charges are accumulated on a common voltage line. These charges can affect the data or result in damage to adjacent vertical cells. Accordingly, there is a need to mitigate accumulated charges that can affect all cells connected to the common voltage line. Various mitigation methods have been proposed. However, they result in an increased number of processing steps, manufacturing time, and cost.

SUMMARY

Embodiments of the inventive concept provide a non-volatile memory device that may be manufactured through a simplified manufacturing process and is capable of performing reliable operations, a method of manufacturing the same, and a memory system including the same.

According to an aspect of the inventive concept, a non-volatile memory device includes a first structure; a second structure; and a connection layer, wherein the first structure includes: a first substrate; a peripheral circuit disposed on the first substrate; a first insulation structure disposed on the first substrate; a plurality of first bonding pads disposed on the first insulation structure; and a first interconnect structure surrounded by the first insulation structure, wherein the first interconnect structure electrically connects the peripheral circuit to the first bonding pads; wherein the second structure includes: a conductive etch stop layer; a common source line layer disposed on the conductive etch stop layer; a stacked structure including a plurality of gate layers and a plurality of interlayer insulation layers, wherein gate layers of the plurality of gate layers are alternately stacked with interlayer insulation layers of the plurality of interlayer insulation layers on the common source line layer; a plurality of channel structures penetrating through a cell region of the stacked structure and contacting the common source line layer; a second insulation structure disposed on the stacked structure; a plurality of second bonding pads disposed on the second insulation structure; and a second interconnect structure surrounded by the second insulation structure, wherein the second interconnect structure electrically connects the gate layers and the channel structures to the second bonding pads, wherein the second insulation structure contacts the first insulation structure, wherein the second bonding pads contact the first bonding pads, respectively, and wherein the second structure is bonded to the first structure; wherein the connection layer includes: a third insulation structure disposed on the second structure and covering the conductive etch stop layer and the second insulation structure; an input/output via penetrating through the third insulation structure and connected to the second interconnect structure; and an input/output pad connected to the input/output via and disposed on the third insulation structure, and wherein an interface between the second insulation structure and the third insulation structure is located at a vertical level between a top surface and a bottom surface of the conductive etch stop layer.

According to another aspect of the inventive concept, a non-volatile memory device includes a first structure; a second structure bonded to the first structure; and a connection layer disposed on the second structure, wherein the first structure includes: a first substrate; a peripheral circuit disposed on the first substrate; a first insulation structure disposed on the first substrate and the peripheral circuit; a plurality of first bonding pads disposed on the first insulation structure; and a first interconnect structure surrounded by the first insulation structure and electrically connecting the peripheral circuit to the first bonding pads; wherein the second structure includes: a conductive etch stop layer including a conductive material containing carbon; a common source line layer disposed to cover a bottom surface of the conductive etch stop layer and overlap the conductive etch stop layer in a vertical direction normal to the first substrate, and which includes a conductive material not containing carbon; a stacked structure including a plurality of gate layers and a plurality of interlayer insulation layers and disposed on the common source line layer, wherein gate layers of the plurality of gate layers are alternately stacked with interlayer insulation layers of the plurality of interlayer insulation layers; a plurality of channel structures penetrating through a cell region of the stacked structure and contacting the common source line layer; a word line cut structure disposed in the stacked structure and extending in a horizontal direction; a second insulation structure disposed on the stacked structure; a plurality of second bonding pads disposed on the second insulation structure, wherein the second bonding pads are respectively bonded to the first bonding pads; and a second interconnect structure surrounded by the second insulation structure and electrically connecting the gate layers and the channel structures to the second bonding pads, and wherein the connection layer includes: a third insulation structure covering a top surface and upper portions of side surfaces of the conductive etch stop layer and a top surface of the second insulation structure; an input/output via penetrating through the third insulation structure and connected to the second interconnect structure; and an input/output pad connected to the input/output via and disposed on the third insulation structure.

According to another aspect of the inventive concept, a memory system includes a non-volatile memory device including a first structure, a second structure bonded to the first structure, and a connection layer disposed on the second structure; and a memory controller electrically connected to the non-volatile memory device and configured to control the non-volatile memory device, wherein the first structure includes: a first substrate; a peripheral circuit disposed on the first substrate; a first insulation structure disposed on the first substrate and the peripheral circuit; a plurality of first bonding pads disposed on the first insulation structure; and a first interconnect structure surrounded by the first insulation structure and electrically connecting the peripheral circuit and the plurality of first bonding pads; wherein the second structure includes: a conductive etch stop layer; a common source line layer disposed on the conductive etch stop layer; a stacked structure including a plurality of gate layers and a plurality of interlayer insulation layers disposed on the common source line layer, wherein gate layers of the plurality of gate layers are alternately stacked with interlayer insulation layers of the plurality of interlayer insulation layers; a plurality of channel structures penetrating through a cell region of the stacked structure and contacting the common source line layer; a second insulation structure disposed on the stacked structure; a plurality of second bonding pads disposed on the second insulation structure; and a second interconnect structure surrounded by the second insulation structure and electrically connecting the gate layers and the channel structures to the plurality of second bonding pads, wherein the second insulation structure contacts the first insulation structure, the plurality of second bonding pads respectively contact the plurality of first bonding pads, and the second structure is bonded to the first structure, wherein the connection layer includes a third insulation structure disposed on the second structure and covering the conductive etch stop layer and the second insulation structure; an input/output via penetrating through the third insulation structure and connected to the second interconnect structure; and an input/output pad disposed on the third insulation structure and connected to the input/output via, and wherein an interface between the second insulation structure and the third insulation structure is disposed at a vertical level between a top surface and a bottom surface of the conductive etch stop layer, and the third insulation structure covers the top surface and upper portions of side surfaces of the conductive etch stop layer and a top surface of the second insulation structure.

According to another aspect of the inventive concept, a method of manufacturing a non-volatile memory device includes forming a first structure, wherein the first structure includes: a first substrate; a peripheral circuit disposed on the first substrate; a first insulation structure disposed on the first substrate and the peripheral circuit; a plurality of first bonding pads disposed on the first insulation structure; and a first interconnect structure surrounded by the first insulation structure and electrically connecting the peripheral circuit and the first bonding pads; forming a second structure, wherein the second structure includes: a conductive etch stop layer; a common source line layer disposed on the conductive etch stop layer; a stacked structure including a plurality of gate layers and a plurality of interlayer insulation layers disposed on the common source line layer, wherein gate layers of the plurality of gate layers are alternately stacked with interlayer insulation layers of the plurality of interlayer insulation layers; a plurality of channel structures penetrating through a cell region of the stacked structure and contacting the common source line layer; a second insulation structure disposed on the stacked structure; a plurality of second bonding pads disposed on the second insulation structure; and a second interconnect structure surrounded by the second insulation structure and electrically connecting the gate layers and the channel structures to the second bonding pads; bonding the second structure to the first structure, such that the second insulation structure contacts the first insulation structure and each of the plurality of second bonding pads respectively contact each of the plurality of first bonding pads; and removing the second substrate to expose the conductive etch stop layer and the second insulation structure.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
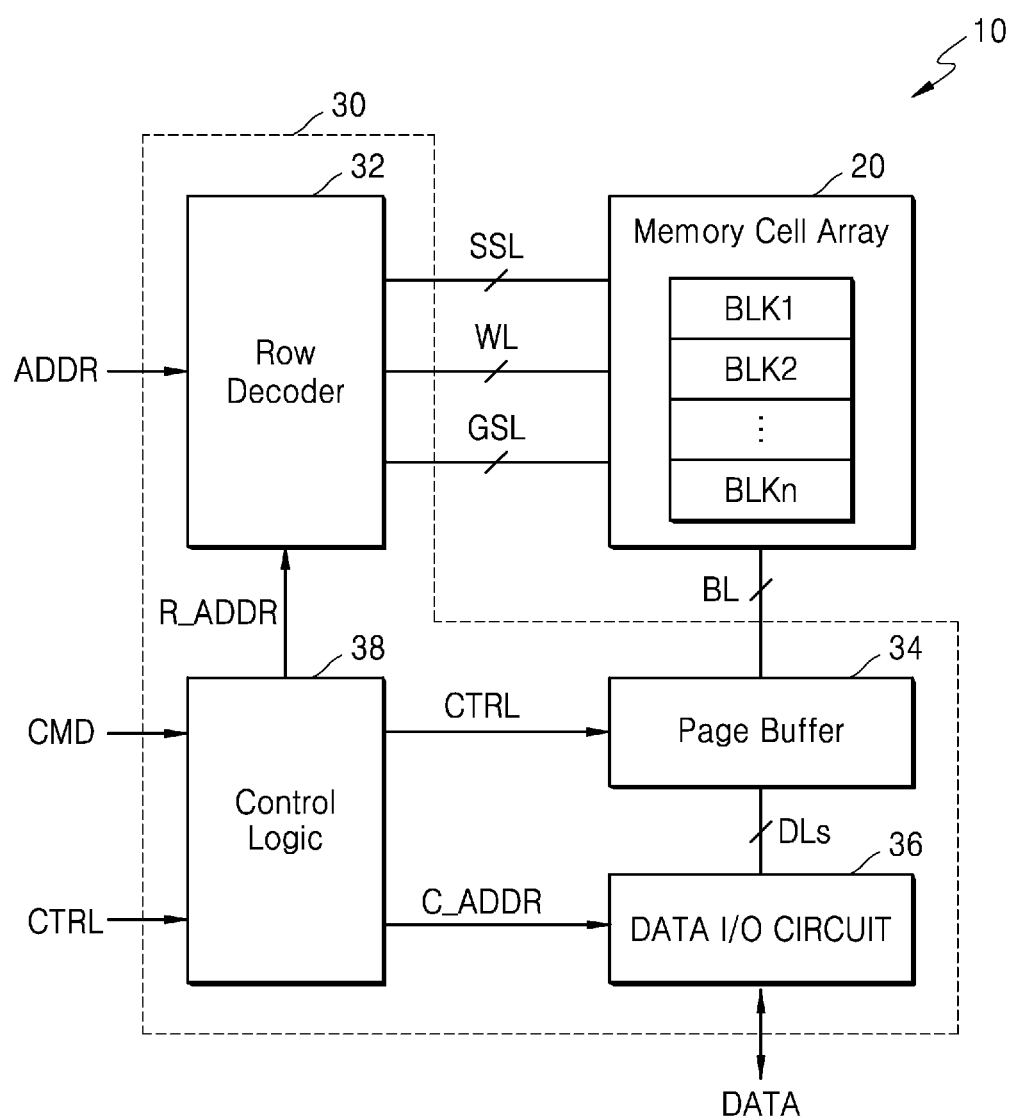
FIG. 1 is a block diagram of a non-volatile memory device according to example embodiments of the inventive concept.

Hereinafter, embodiments of the inventive concept will be described in detail with reference to the accompanying drawings. Like components are denoted by like reference numerals throughout the specification, and to the extent any description is omitted, it will be appreciated that description of similar components may be found throughout in the specification.

FIG. 1 is a block diagram of a non-volatile memory device according to example embodiments of the inventive concept.

Referring to FIG. 1, a non-volatile memory device 10 may include a memory cell array 20 and a peripheral circuit 30. The memory cell array 20 includes a plurality of memory cell blocks BLK1, BLK2, . . . , and BLKn. The memory cell blocks BLK1, BLK2, . . . , and BLKn may each include a plurality of memory cells. The memory cell blocks BLK1, BLK2, . . . , and BLKn may be connected to the peripheral circuit 30 through a bit line BL, a word line WL, a string select line SSL, and a ground select line GSL.

The peripheral circuit 30 may include a row decoder 32, a page buffer 34, a data input/output circuit 36, and a control logic 38. In some embodiments, the peripheral circuit 30 may further include an input/output interface, column logic, a voltage generator, a pre-decoder, a temperature sensor, a command decoder, an address decoder, an amplifier circuit, etc.

The memory cell array 20 may be connected to the page buffer 34 through the bit line BL, and the memory cell array 20 may be connected to the row decoder 32 through the word line WL, the string select line SSL, and the ground select line GSL. In the memory cell array 20, the memory cells included in each of the memory cell blocks BLK1, BLK2, . . . , and BLKn may each be a flash memory cell. The memory cell array 20 may include a 3-dimensional memory cell array. The 3D memory cell array may include a plurality of NAND strings, and the NAND strings may each include a plurality of memory cells connected to a plurality of word lines WL vertically stacked on a substrate.

The peripheral circuit 30 may receive an address ADDR, a command CMD, and a control signal CTRL from a device outside of the non-volatile memory device 10 and may transmit and receive data DATA to and from the device outside of the non-volatile memory device 10.

The row decoder 32 may select at least one of the memory cell blocks BLK1, BLK2, . . . , and BLKn in response to and based on an address ADDR received from the outside, and select the word line WL, the string select line SSL, and the ground select line GSL corresponding to a selected memory cell block. The row decoder 32 may transmit a voltage for performing a memory operation to the word line WL corresponding to the selected memory cell block.

The page buffer 34 may be connected to the memory cell array 20 through the bit line BL. The page buffer 34 may operate as a write driver during a program operation and apply a voltage according to the data DATA to be stored in the memory cell array 20 to the bit line BL, and may operate as a sense amplifier during a read operation and sense the data DATA stored in the memory cell array 20. The page buffer 34 may operate according to a control signal CTRL provided from the control logic 38.

The data input/output circuit 36 may be connected to the page buffer 34 through data lines DLs. During a program operation, the data input/output circuit 36 may receive the data DATA from a memory controller and provide the data DATA to be programmed to the page buffer 34 based on a column address C_ADDR provided from the control logic 38. The data input/output circuit 36 may provide the data DATA to be read stored in the page buffer 34 to the memory controller based on the column address C_ADDR provided from the control logic 38 during a read operation.

The data input/output circuit 36 may transmit an address or a command input thereto to the control logic 38 or the row decoder 32. In some embodiments, the peripheral circuit 30 further includes an electrostatic discharge (ESD) circuit and a pull-up/pull-down driver.

The control logic 38 may receive a command CMD and a control signal CTRL from the memory controller. The control logic 38 may provide a row address R_ADDR to the row decoder 32 and provide the column address C_ADDR to the data input/output circuit 36. The control logic 38 may generate various internal control signals used in the non-volatile memory device 10 in response to the control signal CTRL. For example, the control logic 38 may adjust the level of a voltage provided to the word line WL and the bit line BL when a memory operation like a program operation or an erase operation is performed.

Figure 2:
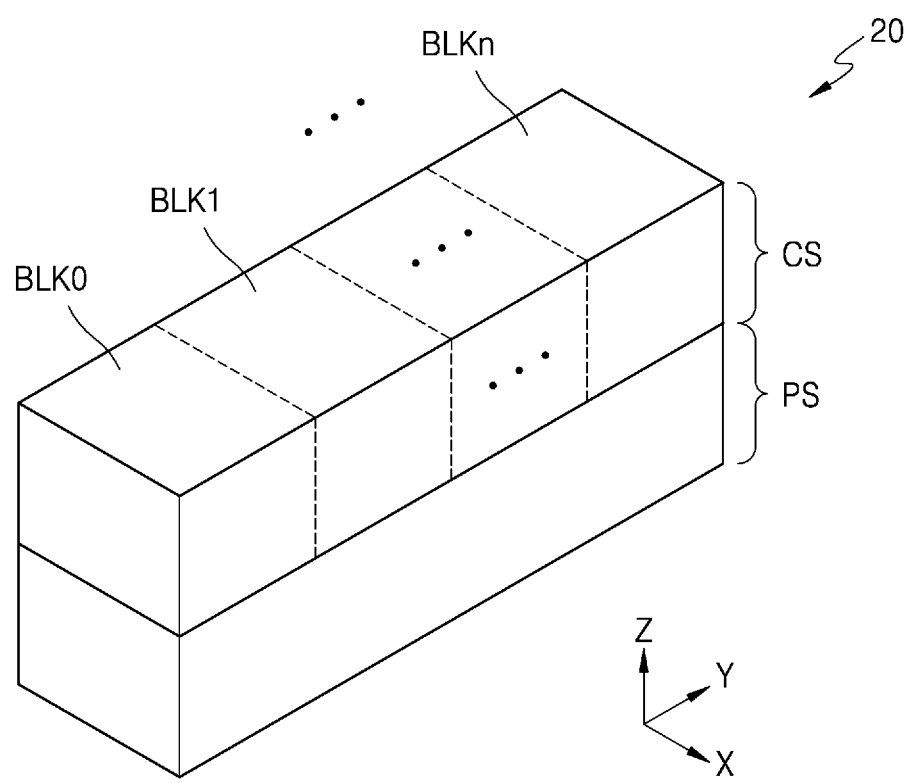
FIG. 2 is a schematic perspective view of a non-volatile memory device according to example embodiments of the inventive concept.

FIG. 2 is a schematic perspective view of a non-volatile memory device according to example embodiments of the inventive concept.

Referring to FIG. 2, the non-volatile memory device 10 includes a cell array structure CS and a peripheral circuit structure PS overlapping each other in a vertical direction (e.g., a Z direction). The cell array structure CS may include the memory cell array 20 described above with reference to FIG. 1. The peripheral circuit structure PS may include the peripheral circuit 30 described above with reference to FIG. 1.

The cell array structure CS may include the memory cell blocks BLK1, BLK2, . . . , and BLKn. The memory cell blocks BLK1. BLK2, . . . , and BLKn may each include 3-dimensionally arranged memory cells.

Figure 3:
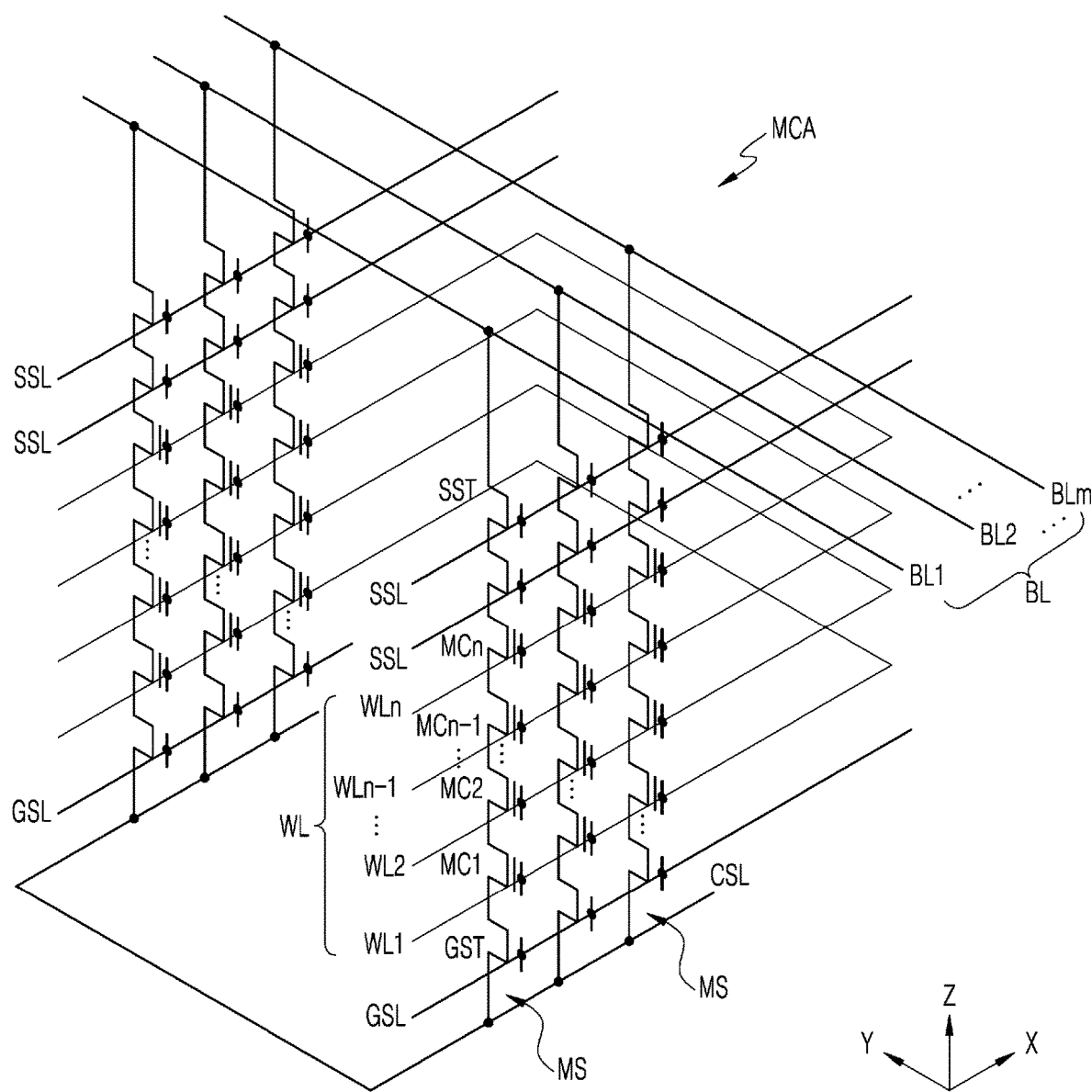
FIG. 3 is an equivalent circuit diagram of a memory cell array of a non-volatile memory device according to example embodiments of the inventive concept.

FIG. 3 is an equivalent circuit diagram of a memory cell array of a non-volatile memory device according to example embodiments of the inventive concept.

Referring to FIG. 3, a memory cell array MCA may include a plurality of memory cell strings MS. The memory cell array MCA may include a plurality of bit lines BL: BL1, BL2, . . . , and BLm, a plurality of word lines WL: WL1, WL2, . . . , WLn−1, and WLn, at least one string select line SSL, at least one ground select line GSL, and a common source line CSL. The memory cell strings MS may be formed between the bit lines BL: BL1, BL2, . . . , and BLm and the common source line CSL. Although FIG. 3 illustrates an example in which the memory cell strings MS each include two string select lines SSL, the inventive concept is not limited thereto. For example, the memory cell strings MS may each include one string select line SSL.

The memory cell strings MS may each include a string select transistor SST, the ground select transistor GST, and a plurality of memory cell transistors MC1, MC2, . . . , MCn−1, and MCn. A drain region of the string select transistor SST may be connected to the bit lines BL: BL1, BL2, . . . , and BLm, and a source region of the ground select transistor GST may be connected to the common source line CSL. The common source line CSL may be a region in which source regions of a plurality of ground select transistors GST are commonly connected.

The string select transistor SST may be connected to the string select line SSL, and the ground select transistor GST may be connected to the ground select line GSL. The memory cell transistors MC1, MC2, . . . , MCn−1, and MCn may be connected to the word lines WL: WL1, WL2, . . . , WLn−1, and WLn, respectively.

Figure 4A:
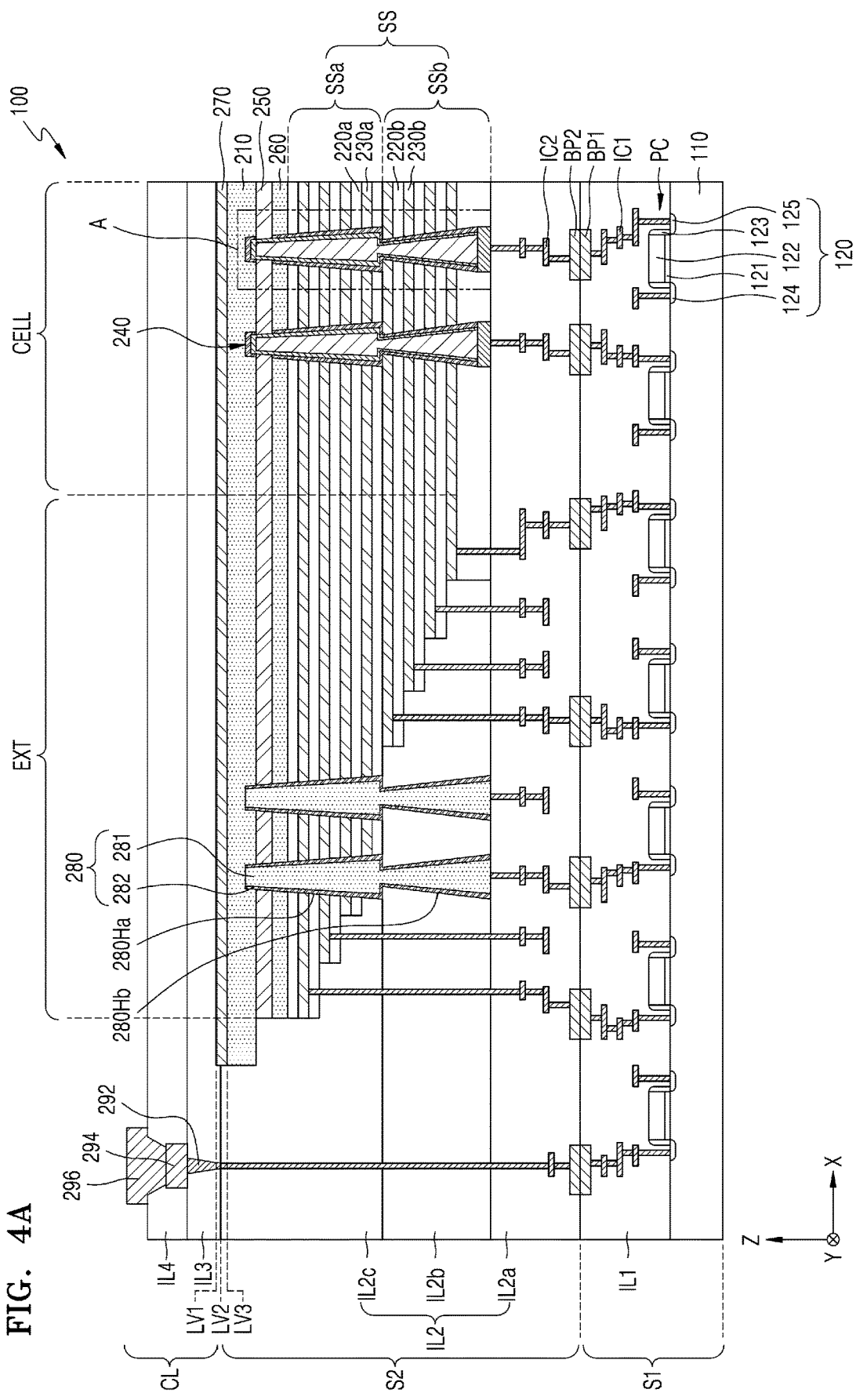
FIG. 4A is a cross-sectional view of a non-volatile memory device according to example embodiments of the inventive concept.
Figure 4B:
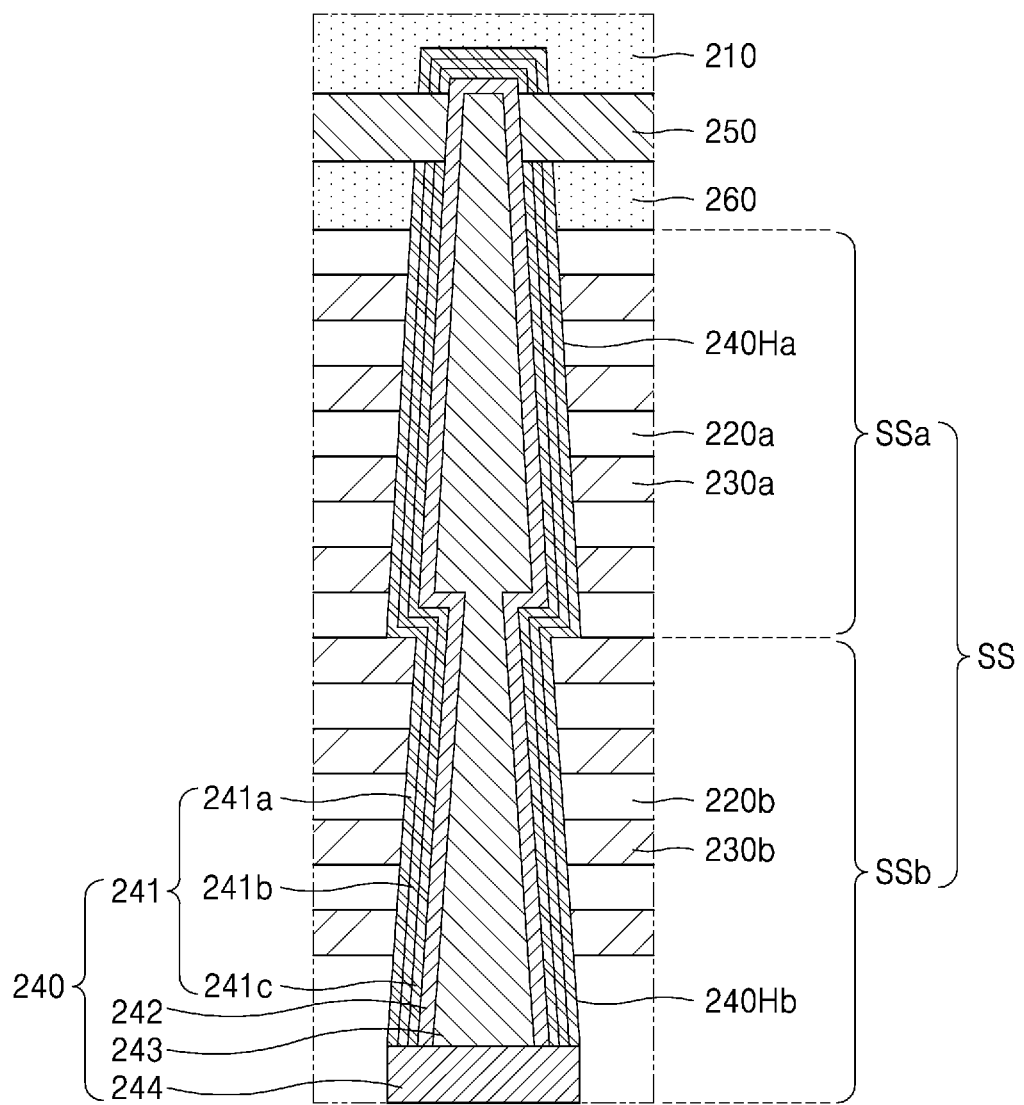
FIG. 4B is an enlarged view of a region A of FIG. 4A.

FIG. 4A is a cross-sectional view of a non-volatile memory device according to example embodiments of the inventive concept, and FIG. 4B is an enlarged view of a region A of FIG. 4A.

Referring to FIGS. 4A and 4B together, a non-volatile memory device 100 includes a first structure S1 and a second structure S2 bonded to the first structure S1. The first structure S1 may contact the second structure S2, such that a plurality of first bonding pads BP1 of the first structure S1 and a plurality of second bonding pads BP2 of the second structure S2 contact each other, respectively. In some embodiments, when a first bonding pad BP1 includes copper (Cu) and a second bonding pad BP2 includes Cu, the first structure S1 may be bonded to the second structure S2 through a Cu—Cu bonding. The non-volatile memory device 100 may further include a connection layer CL disposed on the second structure S2.

The first structure S1 may include a first substrate 110, a peripheral circuit PC on the first substrate 110, a first insulation structure IL1 on the first substrate 110 and the peripheral circuit PC, the first bonding pads BP1 on the first insulation structure IL1, and a first interconnect structure IC1 in the first insulation structure IL1.

The first substrate 110 may include a semiconductor material like a group IV semiconductor material, a group Ill-V semiconductor material, and/or a group II-VI semiconductor material. The group IV semiconductor material may include, for example, silicon (Si), germanium (Ge), or silicon-germanium (SiGe). The group Ill-V semiconductor material may include, for example, gallium arsenide (GaAs), indium phosphorus (InP), gallium phosphorus (GaP), indium arsenic (InAs), indium antimony (InSb), or indium gallium arsenide (InGaAs). The group II-VI semiconductor material may include, for example, zinc telluride (ZnTe) or cadmium sulfide (CdS). The first substrate 110 may be a bulk wafer or an epitaxial layer.

The peripheral circuit PC may be disposed on the first substrate 110. The peripheral circuit PC may include a plurality of transistors 120. In an embodiment, a transistor 120 includes a gate electrode 122 on the first substrate 110, a gate insulation layer 121 between the gate electrode 122 and the first substrate 110, a gate spacer 123 on a side surface of the gate electrode 122, and source/drains 124 and 125 on both sides of the gate electrode 122.

The first insulation structure IL1 may cover the first substrate 110 and the peripheral circuit PC. In some embodiments, the first insulation structure IL1 may include a plurality of insulation layers stacked on the first substrate 110. The first insulation structure IL1 may include an insulation material that includes, for example, silicon oxide, silicon nitride, a low-k material, or a combination thereof. The low-k material may be a material that has a dielectric constant lower than that of silicon oxide. For example, the first insulation structure IL1 may include phosphosilicate glass (PSG), borophosphosilicate glass (BPSG), fluorosilicate glass (FSG), organosilicate glass (OSG), spin-on-glass (SOG), spin-on-polymer, or a combination thereof. In some embodiments, the first insulation structure IL1 may include an ultra low k (ULK) film having an ultra low dielectric constant K from about 2.2 to about 2.4. The ULK film may include a SiOC or a SiCOH.

The first bonding pad BP1 may be disposed on the first insulation structure IL1. In some embodiments, the top surface of the first bonding pad BP1 may be coplanar with the top surface of the first insulation structure IL1. For example, in these embodiments, the first bonding pad BP1 does not protrude from the top surface of the first insulation structure IL1. The first bonding pad BP1 may include a conductive material that includes copper (Cu), gold (Au), silver (Ag), aluminum (Al), tungsten (W), titanium (Ti), tantalum (Ta), or a combination thereof.

The first interconnect structure IC1 may be disposed in the first insulation structure IL1 and may be surrounded by the first insulation structure IL1. The first interconnect structure IC1 may be connected to the peripheral circuit PC and the first bonding pads BP1. The first interconnect structure IC1 may connect the peripheral circuit PC to the first bonding pads BP1 and/or interconnect the transistors 120 in the peripheral circuit PC. The first interconnect structure IC1 may include a plurality of lines, vias interconnecting the lines, and plugs interconnecting the lines and the transistors 120. The first interconnect structure IC1 may include a conductive material like copper (Cu), aluminum (Al), tungsten (W), silver (Ag), gold (Au), or a combination thereof.

As used herein, one component being "on" or "disposed on" another component may refer to the two components overlapping each other in the vertical direction (e.g., the Z direction). For example, a first component disposed "on" a second component may be disposed above or below the second component, and may directly contact the second component or be separated therefrom by intermediary layer(s). Further, as used herein, "surrounding" or "covering" may refer to at least partially surrounding or at least partially covering, respectively. For example, if a layer surrounds a component, the layer may surround lateral (e.g. horizontal) sides of the component, and other side(s) of the component may or may not be surrounded by the layer, as will be indicated by the referenced Figure(s) and accompanying context and description.

The second structure S2 may include a conductive etch stop layer 270, a common source line layer 210 on the conductive etch stop layer 270, a stacked structure SS on the common source line layer 210, a plurality of channel structures 240 penetrating through a cell region CELL of the stacked structure SS, a plurality of dummy channel structures 280 penetrating through a stepped region EXT of the stacked structure SS, a second insulation structure IL2 on the stacked structure SS (e.g., contacting the stacked structure SS), the second bonding pads BP2 on the second insulation structure IL2, and a second interconnect structure IC2 disposed in the second insulation structure IL2 and surrounded by the second insulation structure IL2. The second structure S2 may be disposed on the first structure S1, such that the second insulation structure IL2 contacts the first insulation structure IL1 and the second bonding pads BP2 correspond to the first bonding pads BP1, respectively.

In some embodiments, the second structure S2 may further include a lower conductive layer 250 disposed between the common source line layer 210 and the stacked structure SS. In some embodiments, the second structure S2 may further include a lower support layer 260 disposed between the lower conductive layer 250 and the stacked structure SS.

The common source line layer 210 may include a semiconductor material like a group IV semiconductor material, a group III-V semiconductor material, and a group II-VI semiconductor material. In some embodiments, the common source line layer 210 may include a semiconductor material that does not contain carbon. The common source line layer 210 may include, for example, polysilicon. In some embodiments, the common source line layer 210 may include polysilicon that does not contain carbon. The conductive etch stop layer 270 may contact the common source line layer 210 and serve as a part of a common source line. The conductive etch stop layer 270 may include a material having a resistivity less than that of a material constituting the common source line layer 210. In some embodiments, the conductive etch stop layer 270 may include a conductive material containing carbon. For example, the conductive etch stop layer 270 may include polysilicon containing about 1 atom % (also referred to as atomic percent) or more carbon. For example, the conductive etch stop layer 270 may include polysilicon containing from about 1 atom % to about 5 atom % carbon. In some other embodiments, the conductive etch stop layer 270 may include a low-resistance conductive material like a metal or a conductive metal nitride. For example, the conductive etch stop layer 270 may include Cu, Al, W, Ag, Au, or TiN. The conductive etch stop layer 270 may have a thickness from about 1000 Å to about 3000 Å. The conductive etch stop layer 270 may completely cover a top surface of the common source line layer 210. For example, the horizontal width and the horizontal area of the conductive etch stop layer 270 may be substantially the same as the horizontal width and the horizontal area of the common source line layer 210, and the conductive etch stop layer 270 and the common source line layer 210 may overlap each other in the vertical direction (e.g., the Z direction).

The stacked structure SS may be disposed on the common source line layer 210. The stacked structure SS may include a plurality of gate layers 230a and 230b and a plurality of interlayer insulation layers 220a and 220b alternately stacked on the common source line layer 210. For example, each gate layer may be stacked alternately with an interlayer insulation layer. The stacked structure SS may include a first portion SSa on the common source line layer 210 and a second portion SSb on the first portion SSa. The first portion SSa of the stacked structure SS may include a plurality of first gate layers 230a and a plurality of first interlayer insulation layers 220a alternately stacked on the common source line layer 210. The second portion SSb of the stacked structure SS may include a plurality of second gate layers 230b and a plurality of second interlayer insulation layers 220b alternately stacked on the first portion SSa of the stacked structure SS.

The stacked structure SS may include the cell region CELL and the stepped region EXT. The stepped region EXT of the stacked structure SS may be located at one side of the cell region CELL of the stack structure SS and may have a stepped shape. For example, the cell region CELL of the stacked structure SS may have a stepped shape that descends in the +Z direction.

The gate layers 230a and 230b may include, but are not limited to, a conductive material including tungsten (W), copper (Cu), silver (Ag), gold (Au), aluminum (Al), or a combination thereof. The interlayer insulation layers 220a and 220b may include an insulation material that may include silicon oxide, silicon nitride, a low-k material, or a combination thereof.

The channel structures 240 may each penetrate through the cell region CELL of the stacked structure SS and contact the common source line layer 210. In some embodiments, the channel structures 240 may each penetrate through the cell region CELL of the stack structure SS, the lower conductive layer 250, and the lower support layer 260 and contact the common source line layer 210.

Referring to FIG. 4B, the channel structure 240 may be formed in a first channel hole 240Ha and a second channel hole 240Hb. The channel structure 240 may include a gate insulation layer 241 disposed on inner walls of the first channel hole 240Ha and the second channel hole 240Hb and a channel layer 242 on or adjacent to the gate insulation layer 241. In some embodiments, the channel structure 240 may include a buried insulation layer 243 on or adjacent to the channel layer 242, and a channel pad 244 located at an end of the second channel hole 240Hb.

The gate insulation layer 241 may extend between the common source line layer 210 and the channel layer 242 and between the stacked structure SS and the channel layer 242. The gate insulation layer 241 may include a blocking insulation layer 241a, a charge storage layer 241b, and a tunneling insulation layer 241c sequentially stacked on the inner walls of the first channel hole 240Ha and the second channel hole 240Hb. The blocking insulation layer 241a may include, for example, silicon oxide, silicon nitride, a metal oxide having a dielectric constant greater than that of silicon oxide, or a combination thereof. The metal oxide may include, for example, hafnium oxide, aluminum oxide, zirconium oxide, tantalum oxide, or a combination thereof. The charge storage layer 241b may include, for example, silicon nitride, boron nitride, polysilicon, or a combination thereof. The tunneling insulation layer 241c may include, for example, a metal oxide or silicon oxide. In some embodiments, the blocking insulation layer 241a, the charge storage layer 241b, and the tunneling insulation layer 241c may include an oxide, a nitride, and an oxide, respectively.

The channel layer 242 may surround side surfaces and one end of the buried insulation layer 243. For example, the channel layer 242 may surround an end of the buried insulation layer 243 that is distal from the channel pad 244. The channel layer 242 may include a semiconductor material like a group IV semiconductor material, a group III-V semiconductor material, and a group II-VI semiconductor material. In some embodiments, the channel layer 242 may include polysilicon.

The buried insulation layer 243 may fill a space defined by the channel layer 242 and the channel pad 244. The buried insulation layer 243 may include an insulation material that may include, for example, silicon nitride, silicon oxide, a low-k material, or a combination thereof. In some embodiments, the buried insulation layer 243 may include silicon oxide.

The channel pad 244 may contact the channel layer 242 and the buried insulation layer 243. In some embodiments, the channel pad 244 may also contact the gate insulation layer 241. The channel pad 244 may include a semiconductor material like silicon (Si), germanium (Ge), or silicon-germanium (Si—Ge); a metal like tungsten (W), titanium (Ti), aluminum (Al), copper (Cu), gold (Au), and silver (Ag); a metal nitride like titanium nitride (TiN) or tantalum nitride (TaN), or a conductive material like a combination thereof. In some embodiments, channel pad 244 may include polysilicon.

Referring back to FIG. 4A, the dummy channel structures 280 may penetrate through the stepped region EXT of the stacked structure SS and contact the common source line layer 210. In some embodiments, the dummy channel structures 280 may penetrate through the stepped region EXT of the stacked structure SS, the lower conductive layer 250, and the lower support layer 260 and contact the common source line layer 210. A dummy channel structures 280 may further penetrate through a second portion IL2b and a third portion IL2c of the second insulation structure IL2. A dummy channel structures 280 may be formed in a first dummy channel hole 280Ha penetrating through the stepped region EXT of the stacked structure SS and the third portion IL2c of the second insulation structure IL2, and in a second dummy channel hole 280Hb penetrating through the second portion IL2b of the second insulation structure IL2.

The dummy channel structures 280 may include an insulation layer 282 on the first dummy channel hole 280Ha and the second dummy channel hole 280Hb and a conductive layer 281 on the insulation layer 282. The conductive layer 281 may extend in the first dummy channel hole 280Ha and the second dummy channel hole 280Hb and contact the common source line layer 210. The insulation layer 282 may extend between the conductive layer 281 and the stepped region EXT of the stacked structure SS. The insulation layer 282 may further extend between the conductive layer 281 and the second portion IL2b of the second insulation structure IL2. The insulation layer 282 may further extend between the conductive layer 281 and the third portion IL2c of the second insulation structure IL2. In some embodiments, the insulation layer 282 may further extend between the conductive layer 281 and the lower support layer 260. In some embodiments, insulation layer 282 may further extend between conductive layer 281 and lower conductive layer 250. In some embodiments, the thickness of the insulation layer 282 may be greater than the thickness of the gate insulation layer 241.

The conductive layer 281 may include a semiconductor material or a conductive material like a metal. The conductive layer 281 may include, for example, polysilicon, copper (Cu), tungsten (W), aluminum (Al), gold (Au), silver (Au), or a combination thereof. The insulation layer 282 may include, for example, silicon oxide, silicon nitride, a low-k material, or a combination thereof.

The dummy channel structures 280 penetrating the stepped region EXT of the stacked structure SS may serve as a common source line contact and contact the common source line layer 210. Since a planar area occupied by the common source line contact contacting the common source line layer 210 outside of the stacked structure SS is not needed, the planar area of the non-volatile memory device 100 may be reduced.

The second insulation structure IL2 may cover the stacked structure SS, the channel structures 240, and the dummy channel structures 280. The second insulation structure IL2 may include a plurality of insulation layers. For example, the second insulation structure IL2 may include a first portion IL2a, the second portion IL2b on the first portion IL2a, and the third portion IL2c on the second portion IL2b. The second insulation structure IL2 may include, for example, an insulation material that may include silicon oxide, silicon nitride, a low-k material, or a combination thereof.

The second bonding pads BP2 may be arranged on the second insulation structure IL2. In some embodiments, a top surface of the second bonding pad BP2 may be coplanar with the bottom surface of the second insulation structure IL2. For example, in an embodiment, the second bonding pad BP2 does not protrude from the bottom surface of the second insulation structure IL2. The second bonding pad BP2 may include a conductive material that may include copper (Cu), gold (Au), silver (Ag), aluminum (Al), tungsten (W), titanium (Ti), tantalum (Ta), or a combination thereof.

The second interconnect structure IC2 may be disposed in the second insulation structure IL2 and may be surrounded by the second insulation structure IL2. The second interconnect structure IC2 may be connected to the gate layers 230a and 230b, the channel structures 240, the dummy channel structures 280, and the second bonding pads BP2. For example, the second interconnect structure IC2 may connect the gate layers 230a and 230b, the channel structures 240, and the dummy channel structures 280 to the second bonding pads BP2.

The gate layers 230a and 230b may be connected to the peripheral circuit PC through the second interconnect structure IC2, the second bonding pads BP2, the first bonding pads BP1, and the first interconnect structure IC1. The channel structures 240 may be connected to the peripheral circuit PC through the second interconnect structure IC2, the second bonding pads BP2, the first bonding pads BP1, and the first interconnect structure IC. The dummy channel structures 280 may be connected to the peripheral circuit PC through the second interconnect structure IC2, the second bonding pads BP2, the first bonding pads BP1, and the first interconnect structure IC1. Input/output pads 290 may be connected to the peripheral circuit PC through the second interconnect structure IC2, the second bonding pads BP2, the first bonding pads BP1, and the first interconnect structure IC1.

The second interconnect structure IC2 may include a plurality of lines, vias interconnecting the lines, and a plurality of plugs contacting the gate layers 230a and 230b, the channel structures 240, the dummy channel structures 280, and the input/output pads 290. The second interconnect structure IC2 may include a conductive material like copper (Cu), aluminum (Al), tungsten (W), silver (Ag), gold (Au), or a combination thereof.

The lower conductive layer 250 may extend between the lower support layer 260 and the common source line layer 210. The lower conductive layer 250 may include a semiconductor material or a conductive material like a metal. The lower conductive layer 250 may include polysilicon, aluminum (Al), tungsten (W), silver (Ag), gold (Au), or a combination thereof. In some embodiments, the lower conductive layer 250 may penetrate through the gate insulation layer 241 and contact the channel layer 242 as shown in FIG. 4B.

The lower support layer 260 may extend between the stacked structure SS and the lower conductive layer 250. The lower support layer 260 may include a semiconductor material or a conductive material, such as a metal. The lower support layer 260 may include polysilicon, aluminum (Al), tungsten (W), silver (Ag), gold (Au), or a combination thereof. In some embodiments, when each of the common source line layer 210, the lower conductive layer 250, and the lower support layer 260 includes polysilicon, the boundary between the common source line layer 210 and the lower conductive layer 250 and the boundary between the lower conductive layer 250 and the lower support layer 260 may be unclear or unrecognizable.

The connection layer CL may be disposed on the second structure S2. The connection layer CL may include a third insulation structure IL3 which covers the second insulation structure IL2 and the conductive etch stop layer 270, an input/output via 292 which penetrates through the third insulation structure IL3, an input/output pad 294 disposed on the insulation structure IL3, a fourth insulation structure IL4 which covers the third insulation structure IL3 and the input/output pad 294, and an external connection pad 296 which penetrates through the fourth insulation structure IL4 and is connected to the input/output pad 294.

The third insulation structure IL3 may be disposed on the second insulation structure IL2 and the conductive etch stop layer 270. In some embodiments, the third insulation structure IL3 may include a plurality of stacked insulation layers. The third insulation structure IL3 may include, for example, an insulation material like silicon oxide, silicon nitride, a low-k material, or a combination thereof. In some embodiments, the third insulation structure IL3 may include tetraethyl orthosilicate (TEOS).

The top surface of the conductive etch stop layer 270, e.g., the interface between the conductive etch stop layer 270 and the third insulation structure IL3, may be located at a first vertical level LV1. The top surface of the second insulation structure IL2, e.g., the interface between the second insulation structure IL2 and the third insulation structure IL3, may be located at a second vertical level LV2. The bottom surface of the conductive etch stop layer 270, e.g., the interface between the conductive etch stop layer 270 and the common source line layer 210, may be located at a third vertical level LV3. The first vertical level LV1 may be higher than the second vertical level LV2 and the third vertical level LV3 (e.g., in the +Z direction), and the second vertical level LV2 may be higher than the third vertical level LV3. However, the second vertical level LV2 may be lower the first vertical level LV1, and thus the second vertical level LV2 may be located between the first vertical level LV1 and the third vertical level LV3.

For example, the top surface of the second insulation structure IL2 may be located at a vertical level lower than that of the top surface of the conductive etch stop layer 270, and a portion of the bottom surface of the third insulation structure IL3 contacting the top surface of the second insulation structure IL2 may be located at a vertical level lower than that of a portion of the bottom surface of the third insulation structure IL3 contacting the top surface of the conductive etch stop layer 270. Therefore, upper portions of side surfaces of the conductive etch stop layer 270 may be covered by the third insulation structure IL3, and lower portions of the side surfaces of the conductive etch stop layer 270 may be covered by the second insulation structure IL2.

Figure 7A:
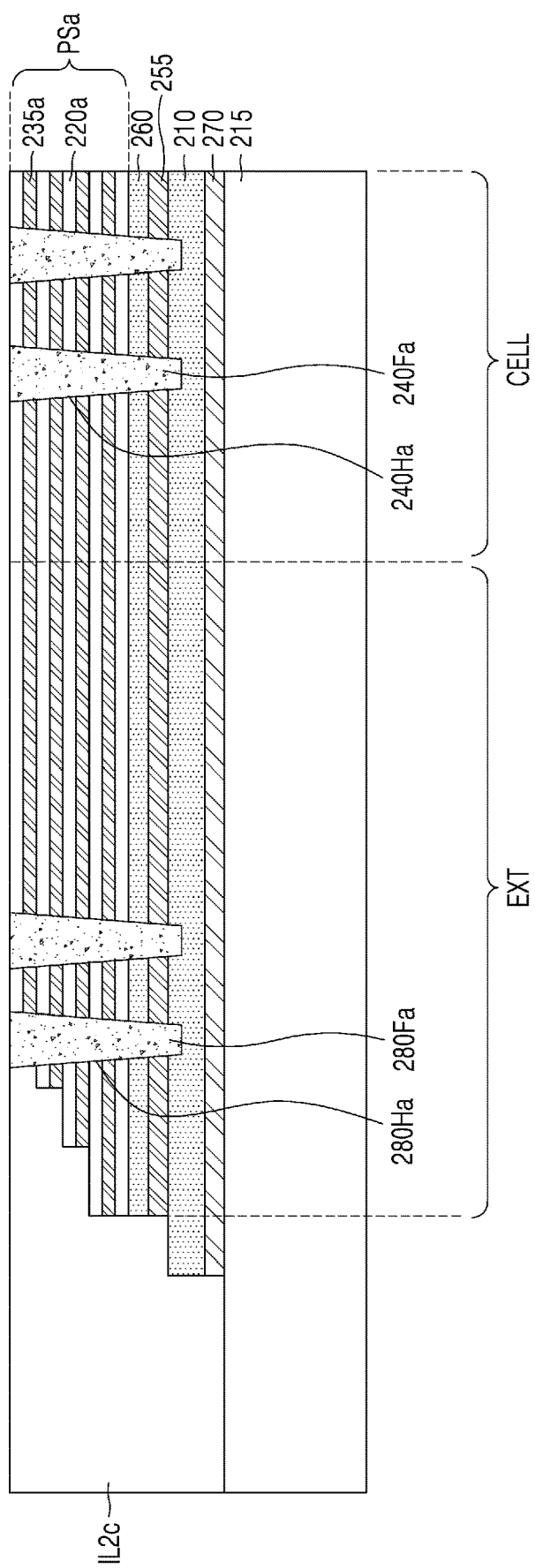
Figure 7B:
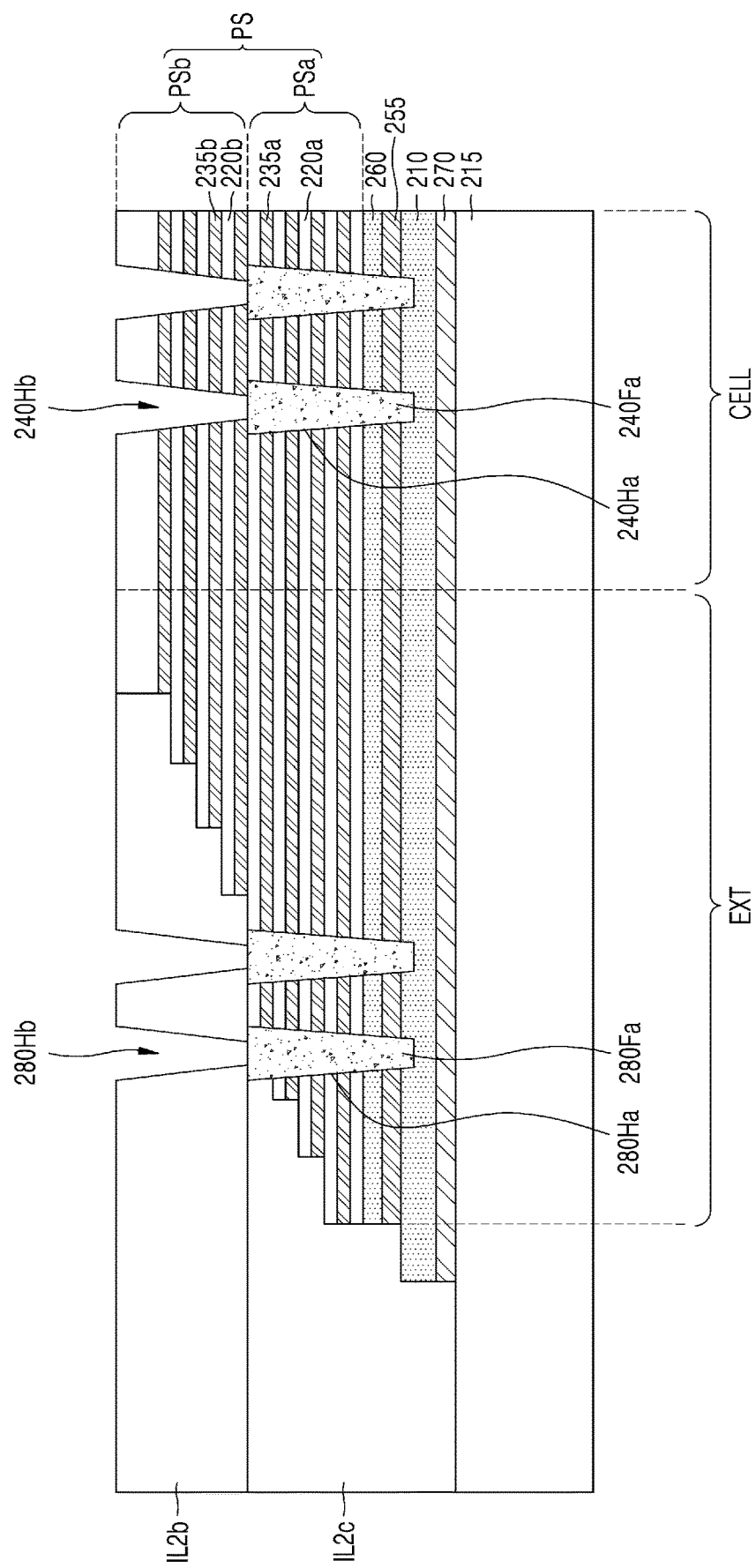
Figure 7D:
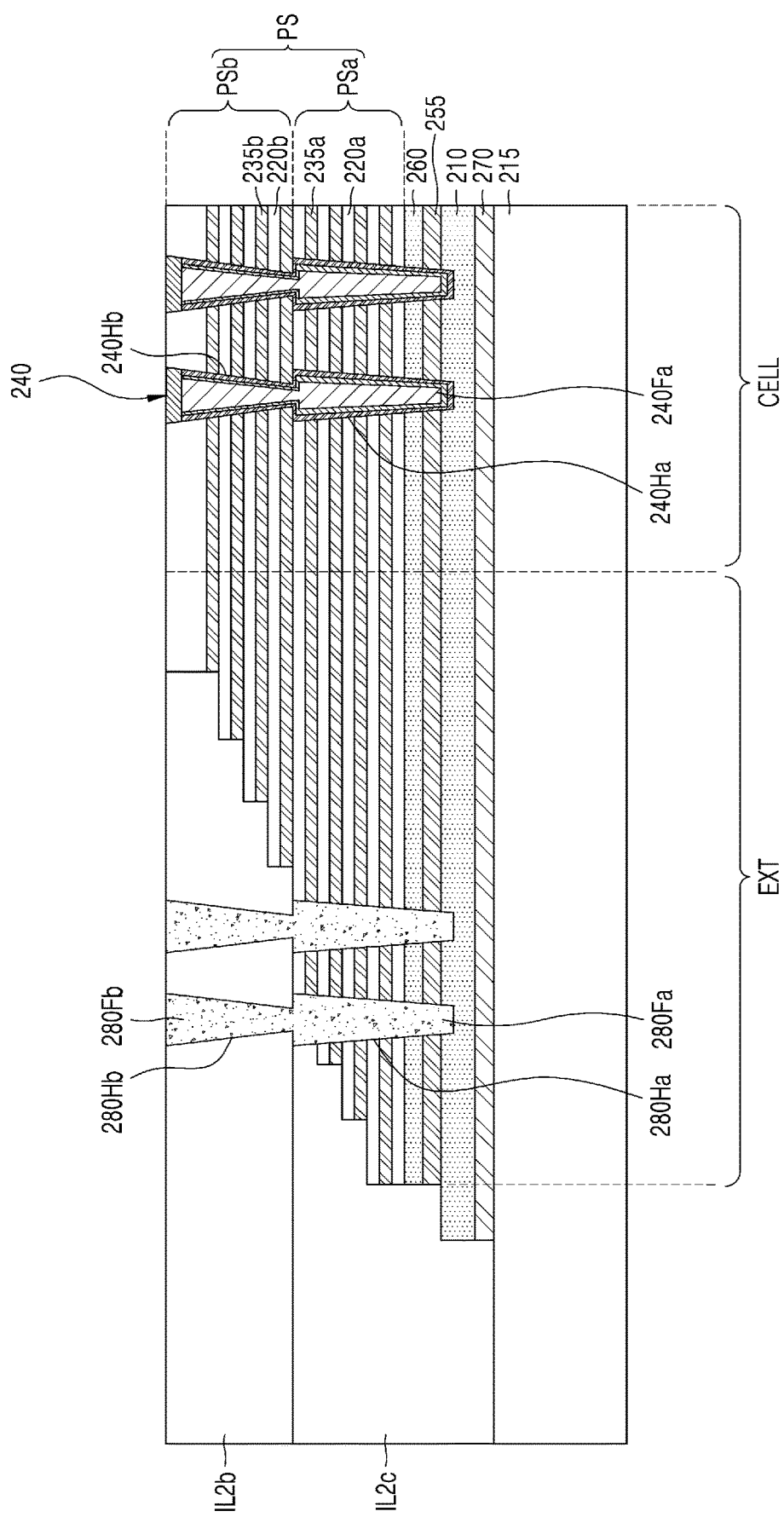
Figure 7F:
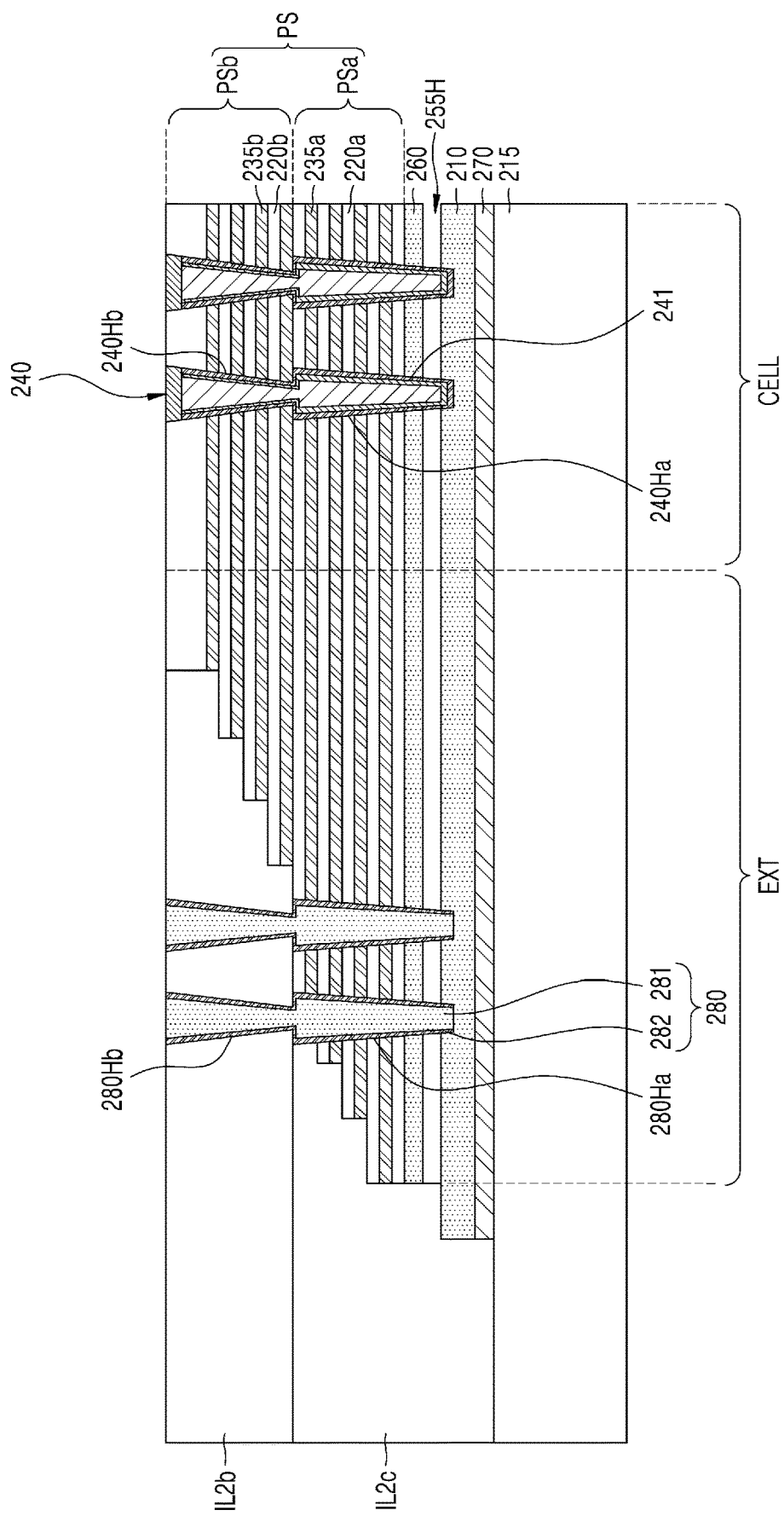
Figure 7G:
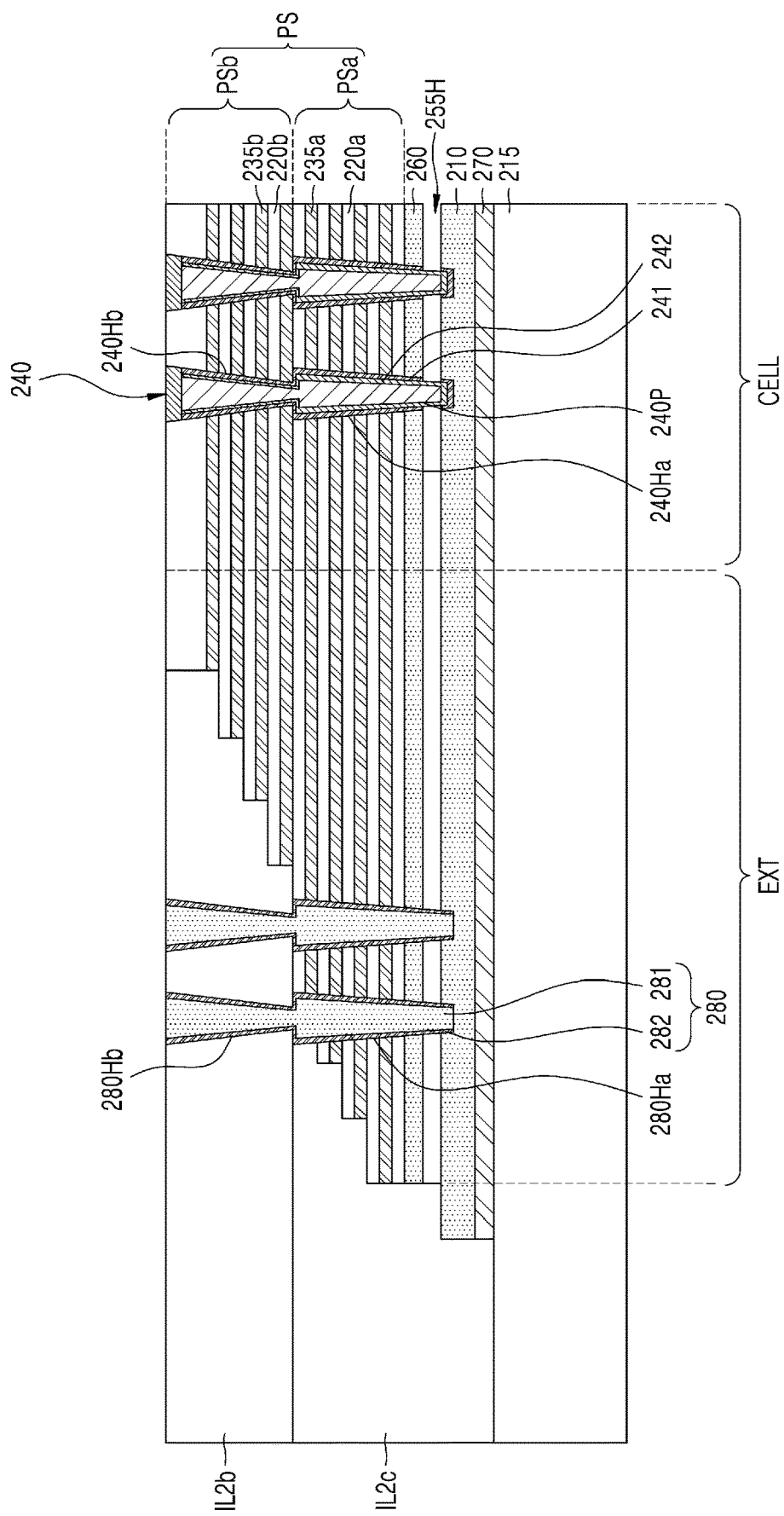
Figure 7H:
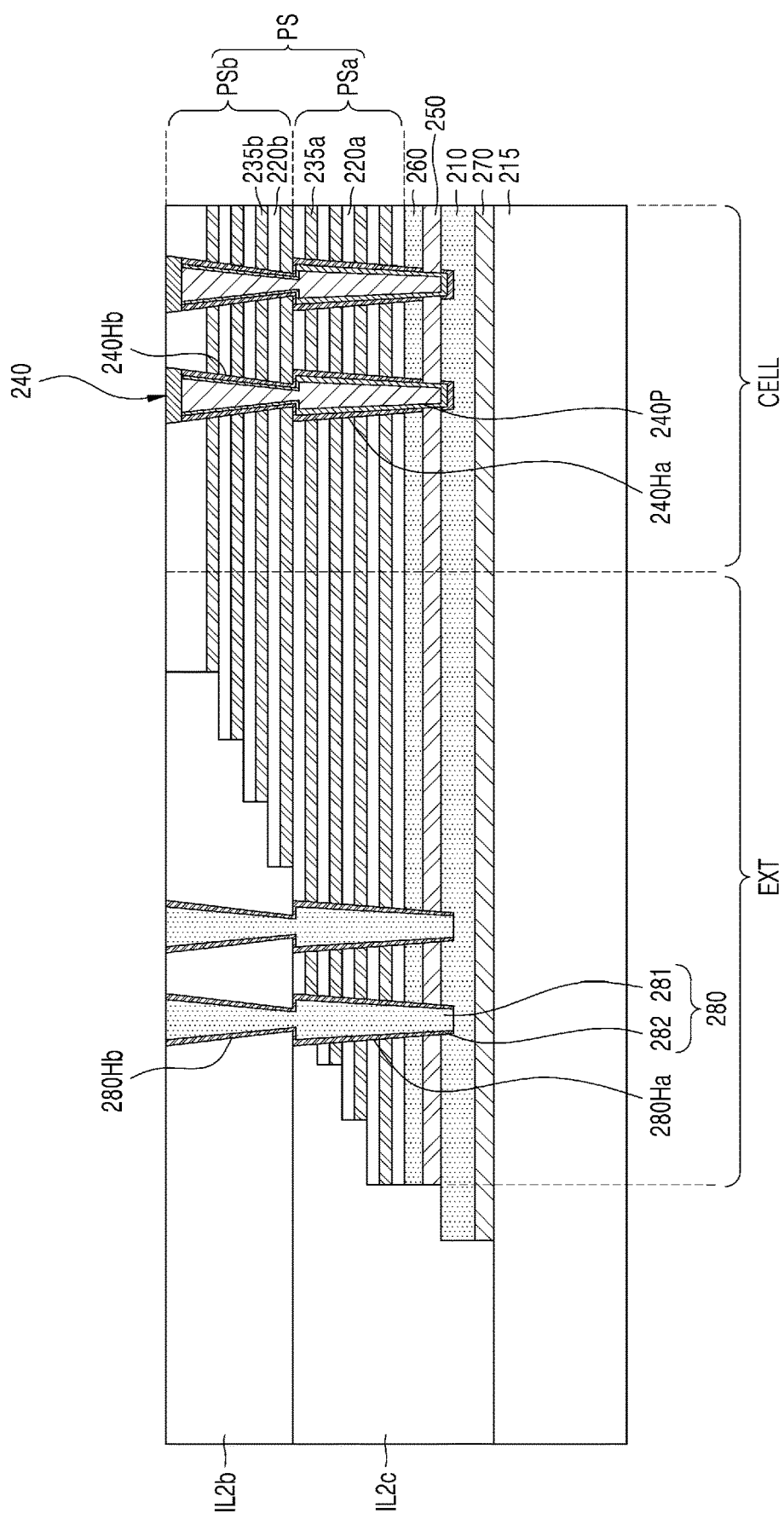
Figure 7I:
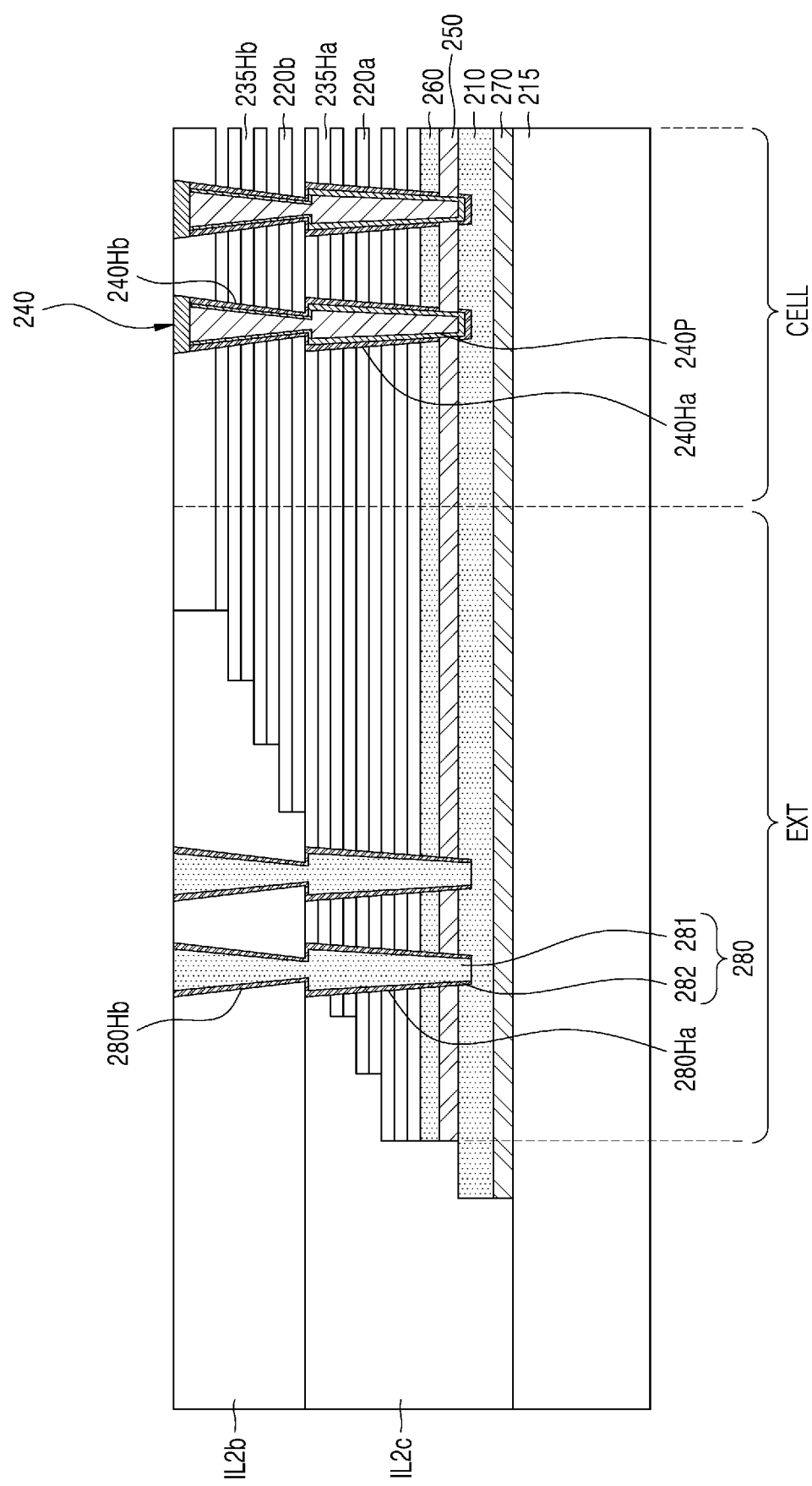
Figure 7J:
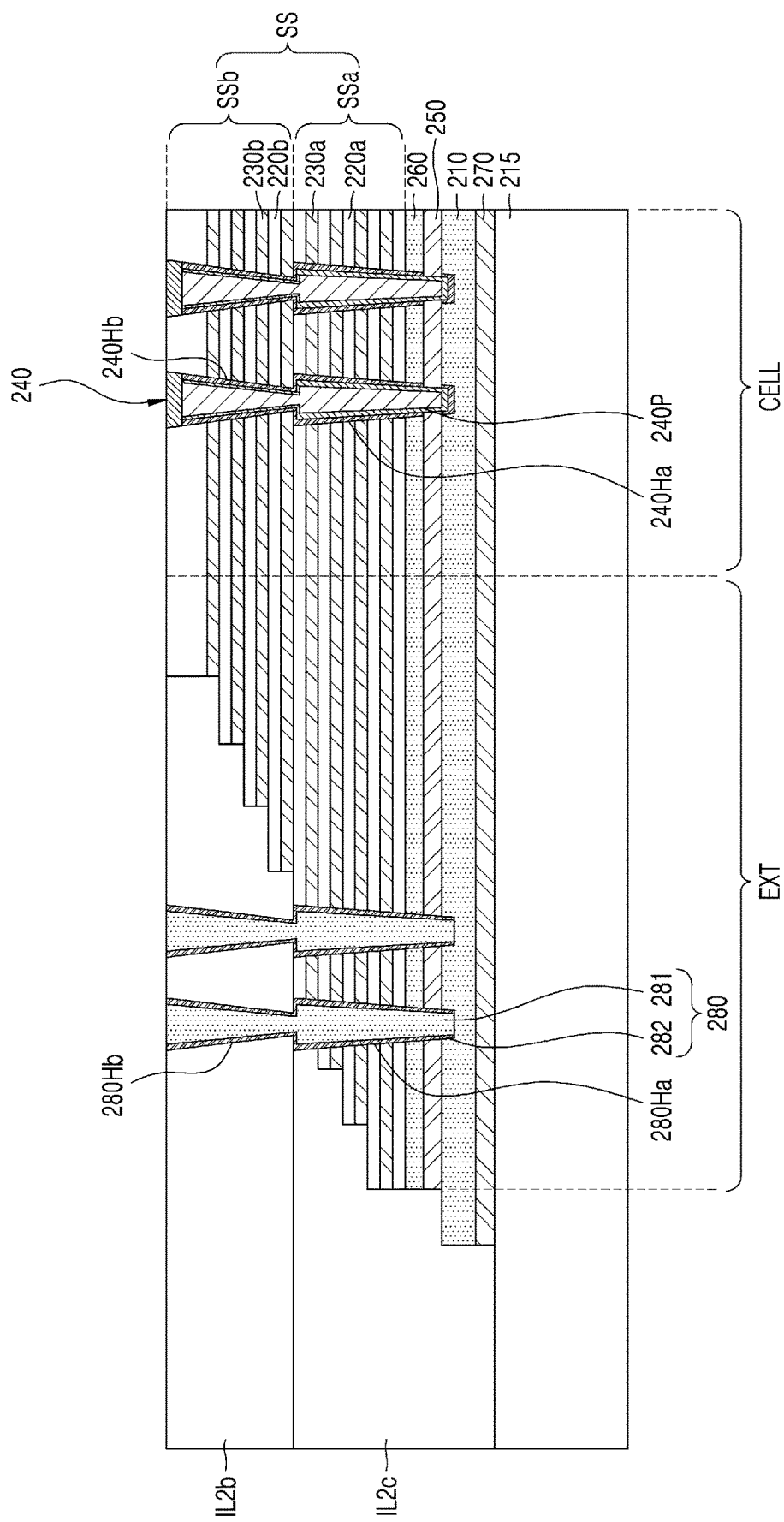
Figure 7K:
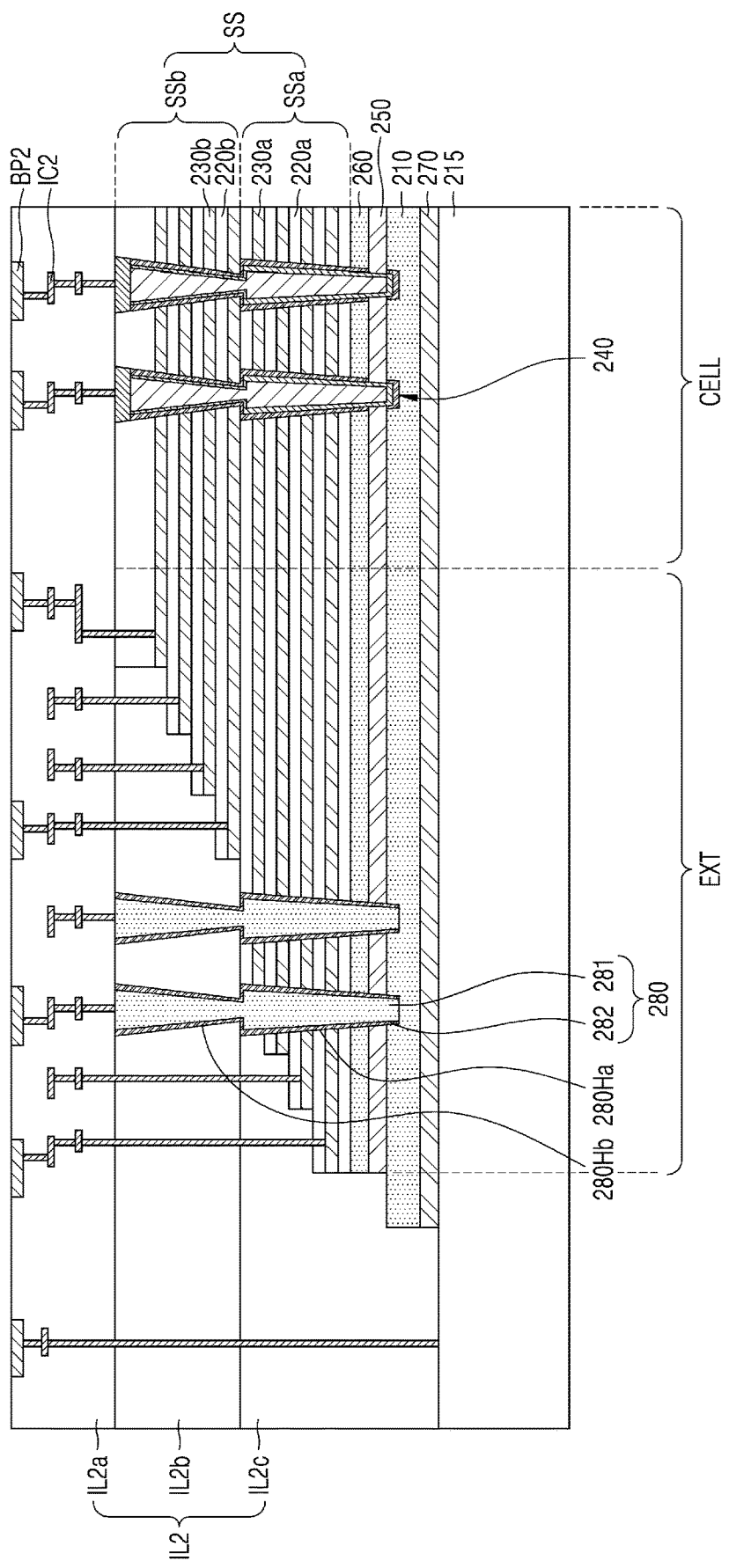
Figure 7L:
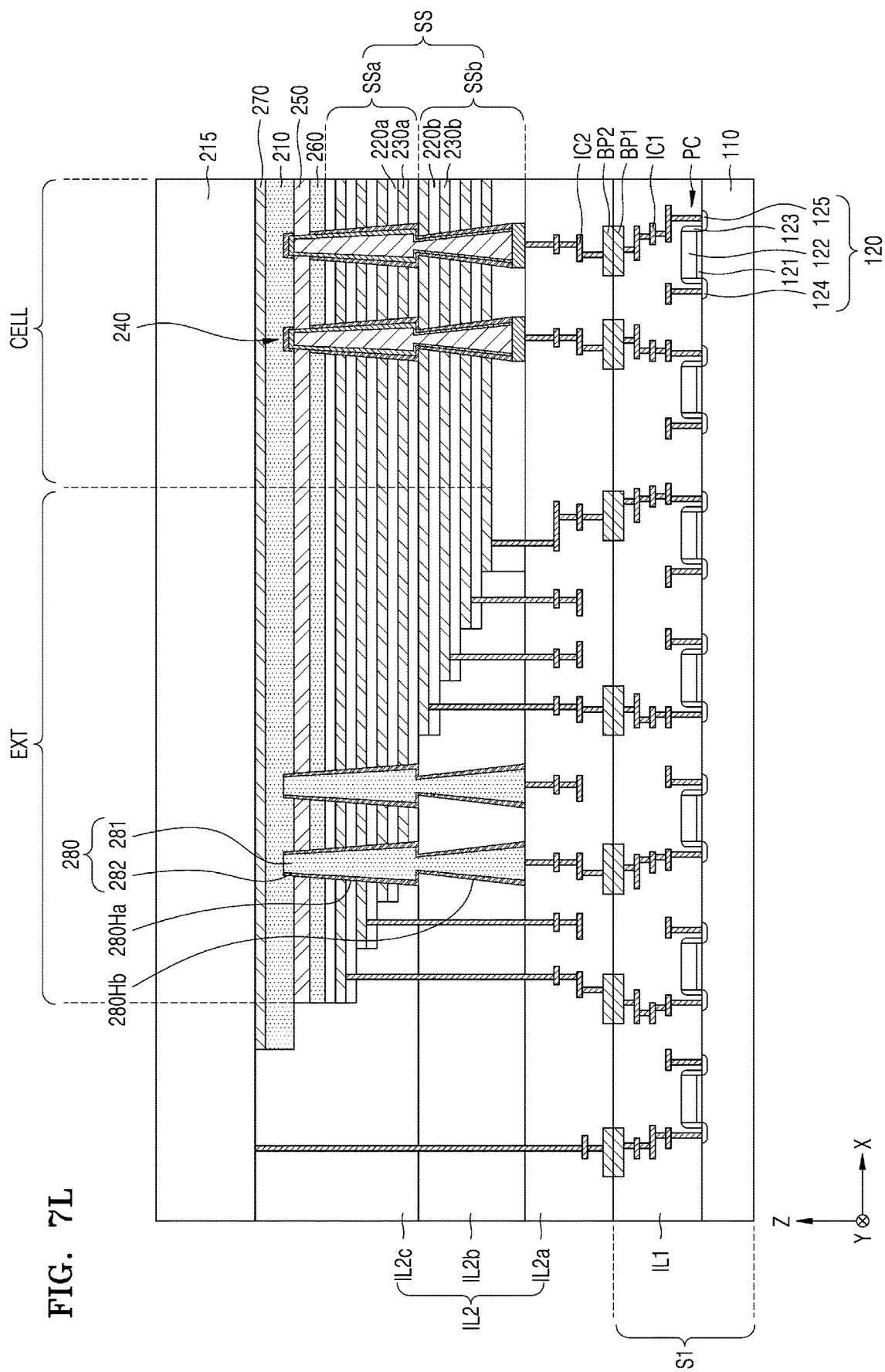
Figure 7M:
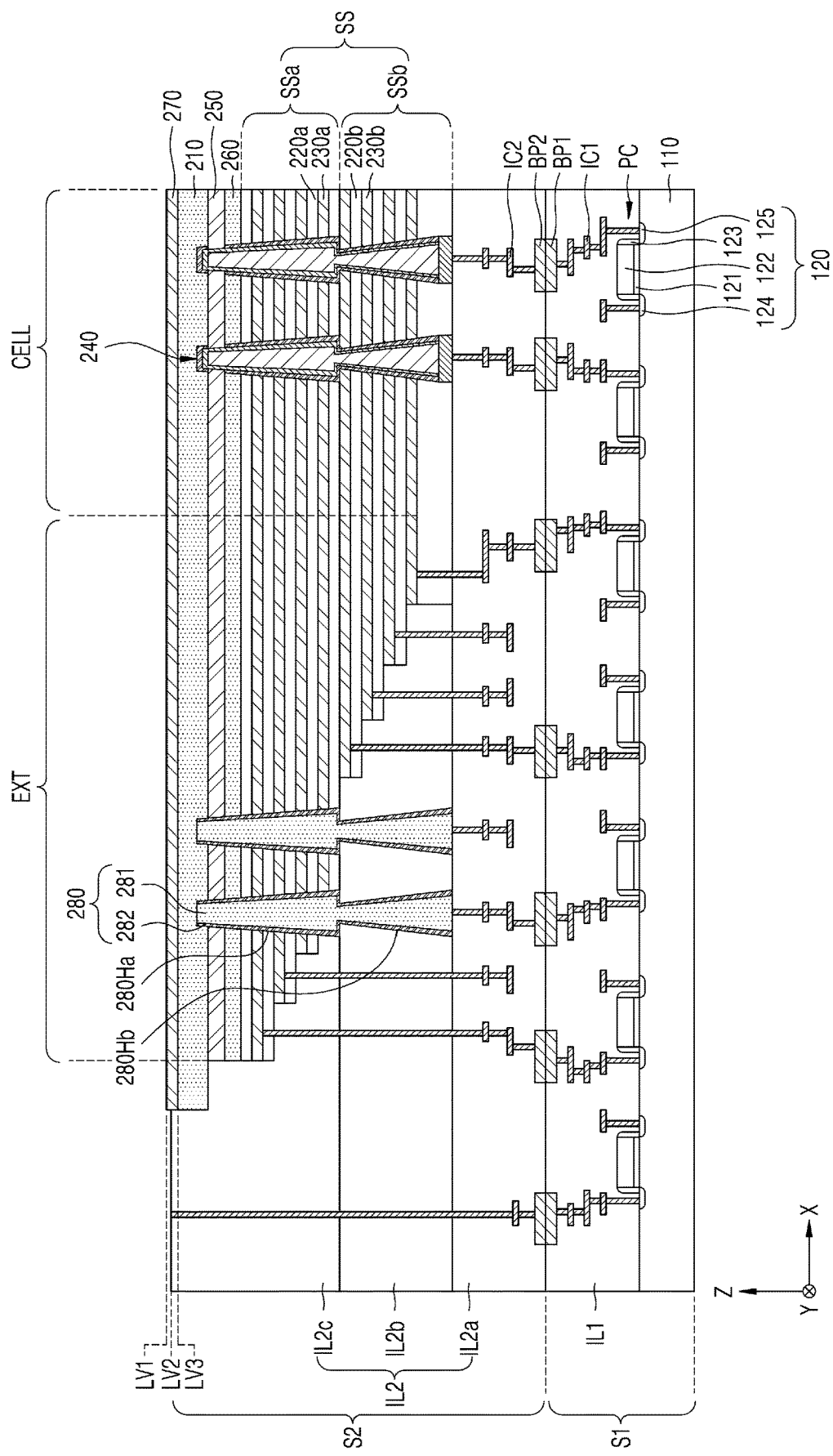

The conductive etch stop layer 270 may serve as an etch stop layer during a process in which a second substrate 215 shown in FIG. 7L is removed as shown in FIG. 7M. To completely remove the second substrate 215 shown in FIG. 7L as shown in FIG. 7M, overetching may be performed even after the second insulation structure IL2 is exposed, and, due to an etch selectivity difference between the conductive etch stop layer 270 and the second insulation structure IL2, an upper portion of the second insulation structure IL2 shown in FIG. 7L may be partially removed, and thus the top surface of the second insulation structure IL2 may become lower than the top surface of the conductive etch stop layer 270. In some embodiments, the second vertical level LV2 may be about 50 Å to about 300 Å lower than the first vertical level LV1. A difference between vertical positions of the first vertical level LV1 and the second vertical level LV2 may be less than a difference between vertical positions of the second vertical level LV2 and the third vertical level LV3. In some embodiments, the difference between the vertical positions of the first vertical level LV1 and the second vertical level LV2 may be about 10% or less of the thickness of the conductive etch stop layer 270.

The input/output via 292 may penetrate through the third insulation structure IL3 and may be connected to the second interconnect structure IC2, and the input/output pad 294 may be disposed on the third insulation structure IL3 and connected to the input/output via 292. The input/output pad 294 may be connected to the second bonding pad BP2 through the input/output via 292 and the second interconnect structure IC2.

The input/output via 292 and the input/output pad 294 may include a conductive material like copper (Cu), aluminum (Al), tungsten (W), silver (Ag), or gold (Au).

The fourth insulation structure IL4 surrounding the input/output pad 294 may be disposed on the third insulation structure IL3. The fourth insulation structure IL4 may cover the top surface of the third insulation structure IL3 and side surfaces of the input/output pad 294, whereas the fourth insulation structure IL4 might not cover and expose at least a portion of the top surface of the input/output pad 294. For example, the fourth insulation structure IL4 may include a photo imageable dielectric (PID) material or a photosensitive polyimide (PSPI). The external connection pad 296 may penetrate through the fourth insulation structure IL4 and may be connected to the input/output pad 294. In some embodiments, the external connection pad 296 may protrude upward from the top surface of the fourth insulation structure IL4. The external connection pad 296 and the input/output pad 294 may include a conductive material like copper (Cu), aluminum (Al), tungsten (W), silver (Ag), or gold (Au). The external connection pad 296 may be exposed to the outside of the non-volatile memory device 100. The external connection pad 296 may be connected to a memory controller which is outside of the non-volatile memory device 100 as will be described later with reference to FIGS. 9 and 10.

Figure 5A:
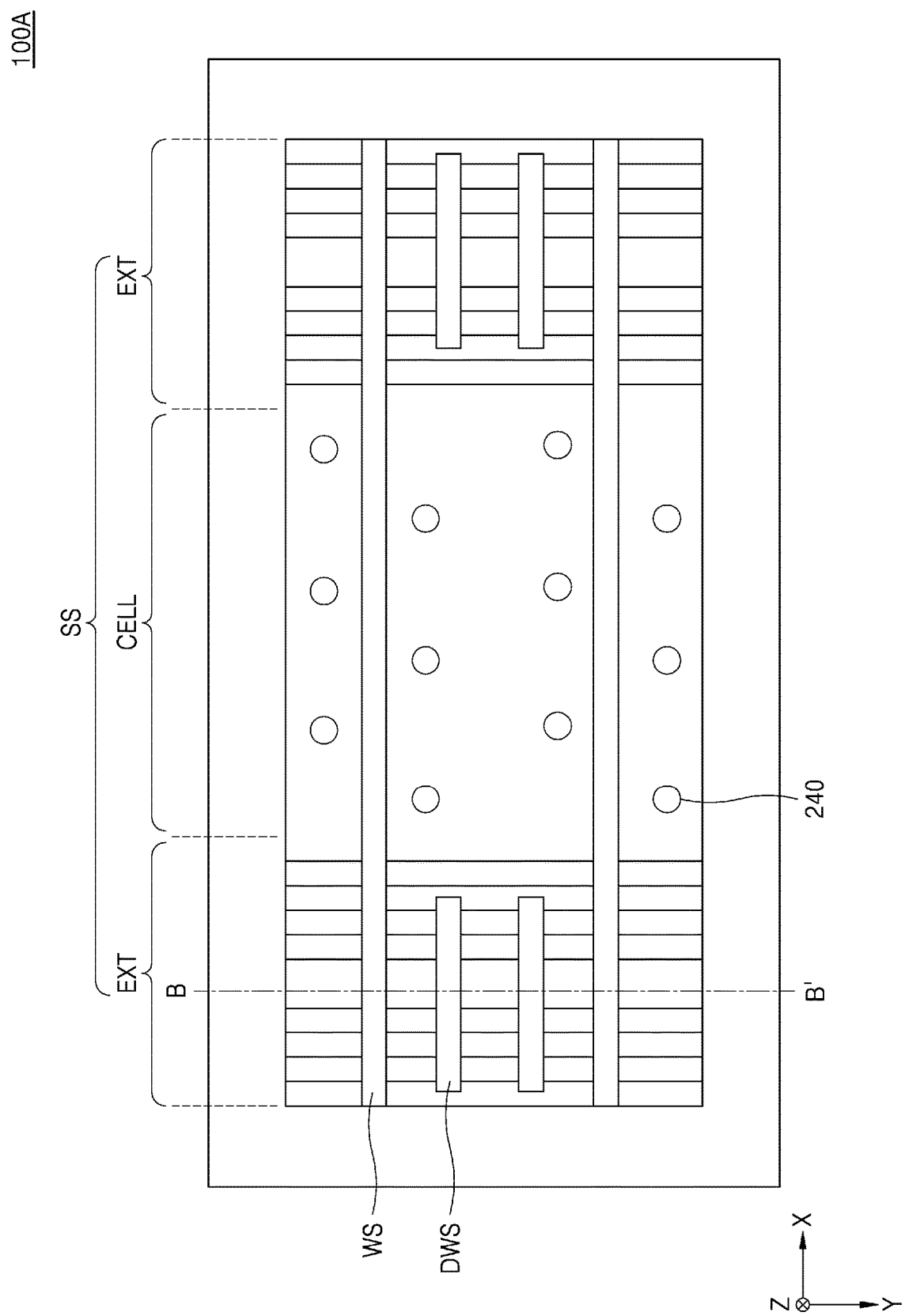
FIG. 5A is a bottom view of a non-volatile memory device according to example embodiments of the inventive concept.
Figure 5B:
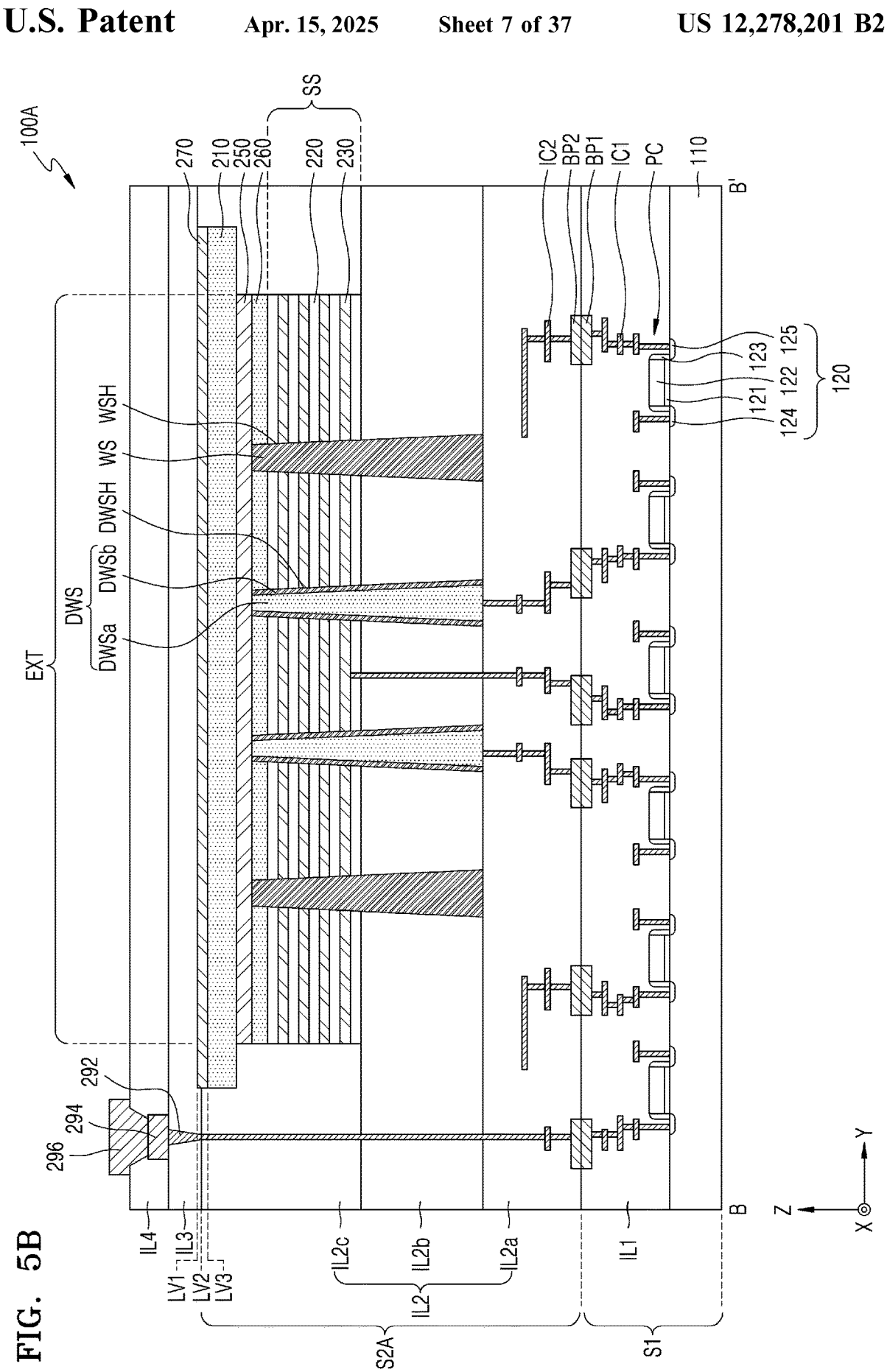
FIG. 5B is a cross-sectional view of the non-volatile memory device taken along a line B-B' of FIG. 5A.

FIG. 5A is a bottom view of a non-volatile memory device according to example embodiments of the inventive concept, and FIG. 5B is a cross-sectional view taken along a line B-B' of FIG. 5A.

Referring to FIGS. 5A and 5B together, an embodiment similar to the non-volatile memory device 100 described above with reference to FIGS. 4A and 4B of a non-volatile memory device 100A may include the first structure S1 and a second structure S2A bonded to the first structure S1. The non-volatile memory device 100A may further include a connection layer CL disposed on the second structure S2A. Since the first structure S1 and the connection layer CL are substantially the same as the first structure S1 and the connection layer CL described above with reference to FIG. 4A, descriptions identical to those already given above may be omitted.

The second structure S2A may further include a word line cut structure WS and a dummy word line cut structure DWS. In some embodiments, the second structure S2A may include the dummy channel structures 280 shown in FIG. 4A or a dummy channel structure having substantially the same configuration as the channel structure 240.

The word line cut structure WS may penetrate through the stacked structure SS and may extend in a first horizontal direction (e.g., an X direction). The word line cut structure WS may penetrate through the stepped region EXT and the cell region CELL of the stacked structure SS in the vertical direction (e.g., the Z direction). The word line cut structure WS may further penetrate through the second portion IL2b of the second insulation structure IL2 and the lower support layer 260. The word line cut structure WS may be formed in a word line cut WSH penetrating through the stacked structure SS. The word line cut WSH may further penetrate through the second portion IL2b of the second insulation structure IL2 and the lower support layer 260. The word line cut structure WS may include, for example, an insulation material including silicon oxide, silicon nitride, a low-k material, or a combination thereof.

The dummy word line cut structure DWS may penetrate through the stepped region EXT of the stacked structure SS in the vertical direction (e.g., the Z direction) and may extend in the first horizontal direction (e.g., the X direction). The dummy word line cut structure DWS may be located in the stepped region EXT of the stacked structure SS and may not penetrate through the cell region CELL of the stacked structure SS. The dummy word line cut structure DWS may further penetrate through the second portion IL2b of the second insulation structure IL2 and the lower support layer 260. The dummy word line cut structure DWS may be formed in a dummy word line cut DWSH penetrating through the stepped region EXT of the stacked structure SS. The dummy word line cut DWSH may further penetrate through the second portion IL2b of the second insulation structure IL2 and the lower support layer 260.

In some embodiments, the dummy word line cut structure DWS does not directly contact the common source line layer 210 and may be in electrical contact with the common source line layer 210 through the lower conductive layer 250. In another embodiment, the dummy word line cut structure DWS may penetrate through the lower conductive layer 250 and directly contact the common source line layer 210.

The dummy word line cut structure DWS may include a conductive layer DWSa in contact with the common source line layer 210 and an insulation layer DWSb between the conductive layer DWSa and the stacked structure SS. In some embodiments, the conductive layer DWSa does not directly contact the common source line layer 210 and may be in electrical contact with the common source line layer 210 through the lower conductive layer 250. The insulation layer DWSb may further extend between the conductive layer DWSa and the second portion IL2b of the second insulation structure IL2. In some embodiments, the insulation layer DWSb may further extend between the conductive layer DWSa and the lower support layer 260. For example, the insulation layer DWSb may be disposed on the dummy word line cut DWSH.

The conductive layer DWSa may include, for example, polysilicon, copper (Cu), tungsten (W), aluminum (Al), gold (Au), silver (Au), or a combination thereof. The insulation layer DWSb may include, for example, silicon oxide, silicon nitride, a low-k material, or a combination thereof.

The second interconnect structure IC2 may be further connected to the dummy word line cut structure DWS. For example, the dummy word line cut structure DWS may be connected to the peripheral circuit PC through the second interconnect structure IC2, the second bonding pads BP2, the first bonding pads BP1, and the first interconnect structure IC1. However, even when the second interconnect structure IC2 is connected to the dummy word line cut structure DWS, the second interconnect structure IC2 might not be connected to the word line cut structure WS.

In the non-volatile memory device 100A according to the inventive concept, since the dummy word line cut structure DWS penetrating through the stepped region EXT of the stacked structure SS is used as a common source line contact for the common source line layer 210, no separate common source line contact may be included, and thus the non-volatile memory device 100A may have a reduced planar area. Further, by removing the need for a separate common source line contact, the number of manufacturing steps of a non-volatile memory device according to the present inventive concept may be reduced, as well as the manufacturing costs.

Figure 6:
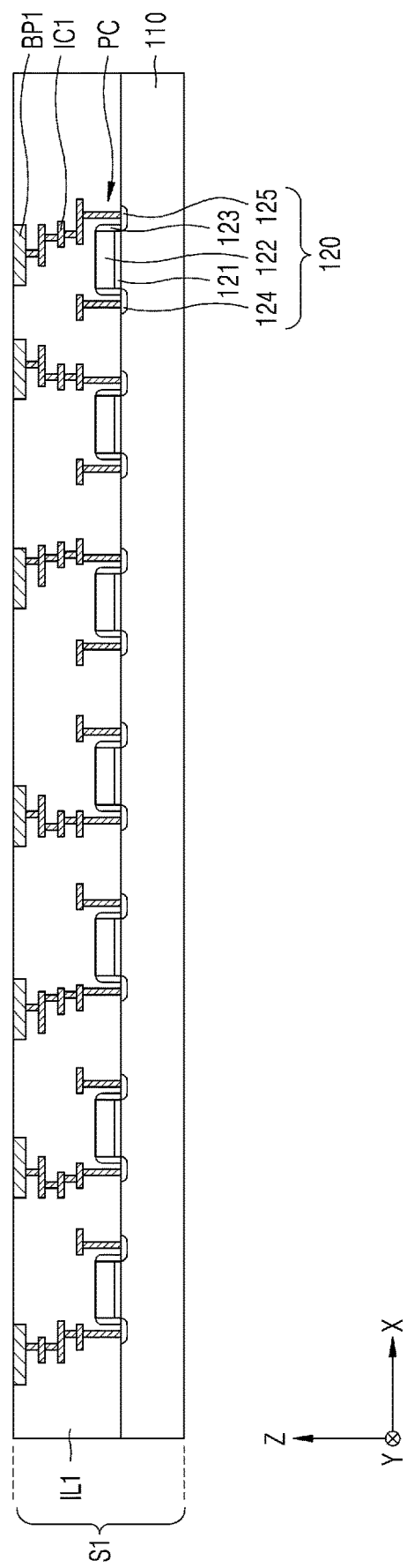
FIGS. 6 and 7A to 7N are cross-sectional diagrams for describing a method of manufacturing a non-volatile memory device according to example embodiments of the inventive concept.
Figure 7N:
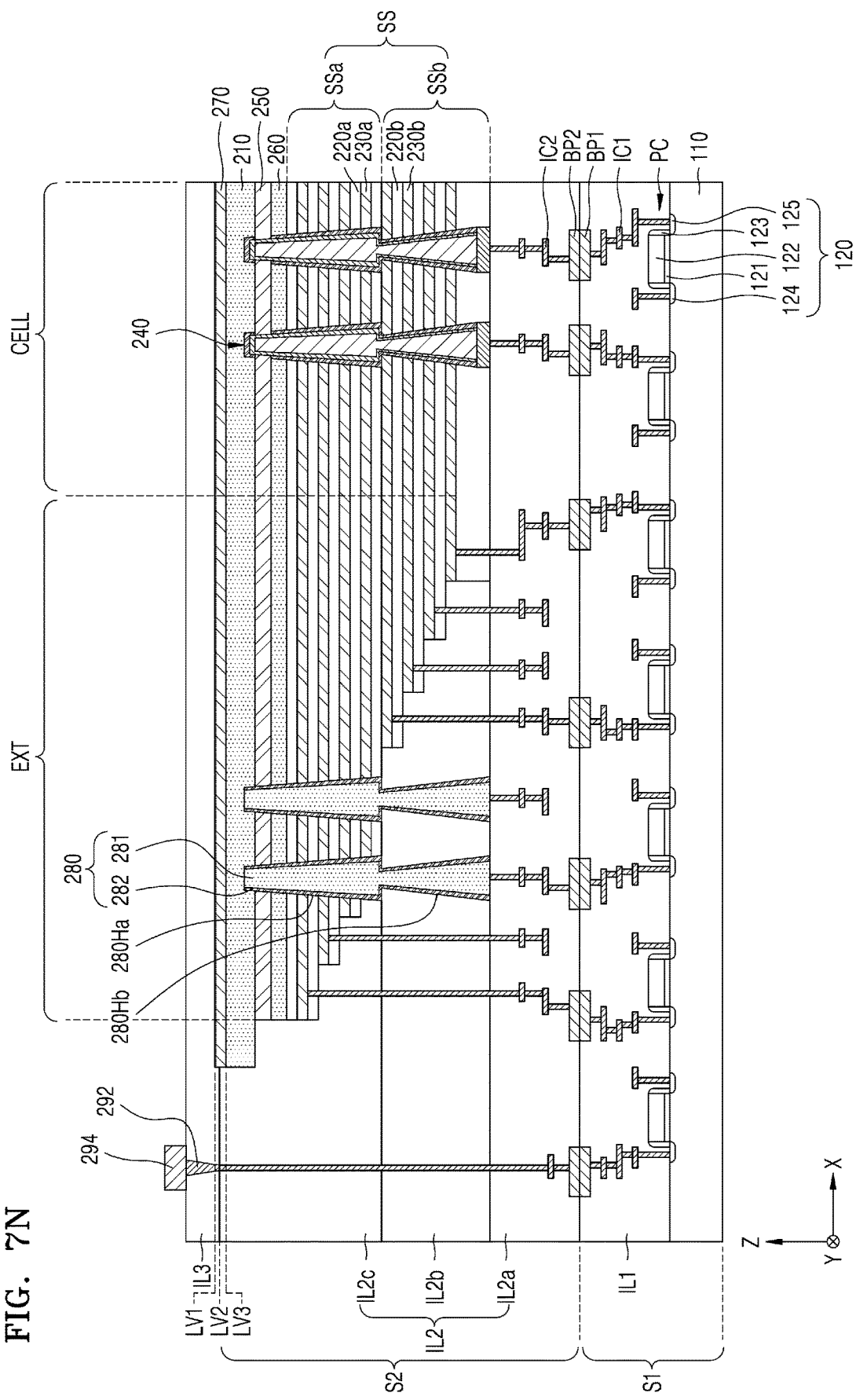

FIGS. 6 and 7A to 7N are cross-sectional diagrams for describing a method of manufacturing a non-volatile memory device according to example embodiments of the inventive concept.

Referring to FIG. 6, the transistors 120 may be formed on the first substrate 110, and the first insulation structure IL1 covering the transistors 120 and the first interconnect structure IC1 surrounded by the first insulation structure IL1 may be formed on the first substrate 110, thereby forming the peripheral circuit PC. The transistors 120 may each be formed to include the gate electrode 122 on the first substrate 110, the gate insulation layer 121 between the gate electrode 122 and the first substrate 110, the gate spacer 123 on a side surface of the gate electrode 122, and the source/drains 124 and 125 on both sides of the gate electrode 122. The first bonding pads BP1 may be formed on the first insulation structure IL1, thereby completing the first structure S1.

Referring to FIG. 7A, the second substrate 215 is prepared. The second substrate 215 may include a semiconductor material like a group IV semiconductor material, a group III-V semiconductor material, and a group II-VI semiconductor material. The common source line layer 210 may be formed on the second substrate 215. A first portion PSa of a preliminary stacked structure may be formed on the common source line layer 210. The first portion PSa of the preliminary stacked structure may be formed by alternately forming the first interlayer insulation layers 220a with a plurality of first sacrificial layers 235a on the common source line layer 210. The first sacrificial layers 235a may each include a material having an etch selectivity with respect to each of the first interlayer insulation layers 220a. For example, when a first interlayer insulation layer 220a includes silicon oxide, a first sacrificial layer 235a may include silicon nitride. By patterning the first portion PSa of the preliminary stacked structure, a stepped region EXT of the first portion PSa of the preliminary stacked structure may be formed into a stepped shape.

The conductive etch stop layer 270 may be formed between the second substrate 215 and the common source line layer 210. The common source line layer 210 and the conductive etch stop layer 270 may overlap each other in the vertical direction and to have substantially the same horizontal width and the same horizontal area.

In some embodiments, a lower sacrificial layer 255 may be formed between the common source line layer 210 and the first portion PSa of the preliminary stacked structure. In some embodiments, the lower support layer 260 may be further formed between the lower sacrificial layer 255 and the first portion PSa of the preliminary stacked structure; e.g., the lower support layer 260 may be formed on the lower sacrificial layer 255. The lower sacrificial layer 255 may include a material having an etch selectivity with respect to the common source line layer 210 and the lower support layer 260. For example, when the common source line layer 210 and the lower support layer 260 include polysilicon, the lower sacrificial layer 255 may include silicon nitride.

The third portion IL2c of a second insulation structure may be formed on the second substrate 215 and the first portion PSa of the preliminary stacked structure, and the first dummy channel hole 280Ha penetrating through a cell region CELL of the first portion PSa of the preliminary stacked structure and the stepped region EXT of the first portion PSa of the preliminary stacked structure may be formed. The first dummy channel hole 280Ha may further penetrate through the third portion IL2c of the second insulation structure. The first channel hole 240Ha and the first dummy channel hole 280Ha may further penetrate through the lower support layer 260 and the lower sacrificial layer 255.

The first channel hole 240Ha and the first dummy channel hole 280Ha may be filled with a first filling layer 240Fa and a first dummy filling layer 280Fa, respectively. In some embodiments, the first filling layer 240Fa and the first dummy filling layer 280Fa may be include polysilicon.

Referring to FIG. 7B, a second portion PSb of the preliminary stacked structure PS may be formed on the first portion PSa of the preliminary stacked structure PS. The preliminary stacked structure PS may include the first portion PSa and the second portion PSb. The second portion PSb of the preliminary stacked structure PS may be formed by alternately forming the second interlayer insulation layers 220b with a plurality of second sacrificial layers 235b on the first portion PSa of the preliminary stacked structure PS. The second sacrificial layers 235b may each include a material having an etch selectivity with respect to each of the second interlayer insulation layers 220b. For example, when a second interlayer insulation layer 220b includes silicon oxide, a second sacrificial layer 235b may include silicon nitride. By patterning the second portion PSb of the preliminary stacked structure PS, a stepped region EXT of the second portion PSb of the preliminary stacked structure PS may be formed into a stepped shape.

The second portion IL2b of the second insulation structure may be formed on the third portion IL2c of the second insulation structure and the first portion PSa and the second portion PSb of the preliminary stacked structure PS. Thereafter, the second channel hole 240Hb penetrating through the second portion PSb of the preliminary stacked structure PS and exposing the first filling layer 240Fa and the second dummy channel hole 280Hb penetrating through the second portion IL2b of the second insulation structure and exposing the first dummy filling layer 280Fa may be formed.

Referring to FIG. 7C, a second filling layer 240Fb and a second dummy filling layer 280Fb may fill the second channel hole 240Hb and the second dummy channel hole 280Hb, respectively. In some embodiments, the second filling layer 240Fb and the second dummy filling layer 280Fb may include polysilicon.

Referring to FIGS. 7C and 7D together, the first filling layer 240Fa and the second filling layer 240Fb may be removed from the first channel hole 240Ha and the second channel hole 240Hb. To prevent the first dummy filling layer 280Fa and the second dummy filling layer 280Fb from being removed during the removal of the first filling layer 240Fa and the second filling layer 240Fb, a mask that covers the second dummy filling layer 280Fb and exposes the second filling layer 240Fb may be formed before the removal of the first filling layer 240Fa and the second filling layer 240Fb. The mask may be removed after the first filling layer 240Fa and the second filling layer 240Fb are removed. The channel structure 240 may be formed in the first channel hole 240Ha and the second channel hole 240Hb from which the first filling layer 240Fa and the second filling layer 240Fb are removed.

Referring to FIGS. 7D and 4B together, the gate insulation layer 241 covering inner walls of the first channel hole 240Ha and the second channel hole 240Hb may be formed. For example, the blocking insulation layer 241a, the charge storage layer 241b, and the tunneling insulation layer 241c may be sequentially formed on the inner walls of the first channel hole 240Ha and the second channel hole 240Hb, thereby forming the gate insulation layer 241. The channel layer 242 may be formed on the gate insulation layer 241, and the buried insulation layer 243 may be formed on the channel layer 242. The buried insulation layer 243 may fill the first channel hole 240Ha and the second channel hole 240Hb together with the gate insulation layer 241 and the channel layer 242.

Thereafter, portions of the gate insulation layer 241, the channel layer 242, and the buried insulation layer 243 that all fill the upper end portion of the second channel hole 240Hb may be removed, and the channel pad 244 filling the upper end portion of the second channel hole 240Hb may be formed, thereby forming the channel structure 240 including the gate insulation layer 241, the channel layer 242, the buried insulation layer 243, and the channel pad 244.

Referring to FIGS. 7D, 7E, and 4B together, the first dummy filling layer 280Fa and the second dummy filling layer 280Fb may be removed from the first dummy channel hole 280Ha and the second dummy channel hole 280Hb. In some embodiments, to prevent the channel structure 240 from being removed during the removal of the first dummy filling layer 280Fa and the second dummy filling layer 280Fb, a mask that covers the channel structure 240 and exposes the second dummy filling layer 280Fb may be formed before the removal of the first dummy filling layer 280Fa and the second dummy filling layer 280Fb. The mask may be removed after the first dummy filling layer 280Fa and the second dummy filling layer 280Fb are removed.

Next, the dummy channel structures 280 may be formed in the first dummy channel hole 280Ha and the second dummy channel hole 280Hb. First, the insulation layer 282 may be formed on inner walls of the first dummy channel hole 280Ha and the second dummy channel hole 280Hb. For example, the insulation layer 282 may be formed on the top surface of the second portion IL2b of the second insulation structure, the inner wall of the second dummy channel hole 280Hb, and the inner wall and the bottom surface of the first dummy channel hole 280Ha. The insulation layer 282 may be anisotropically etched, thereby removing portions of the insulation layer 282 on the top surface of the second portion IL2b of the second insulation structure and the bottom surface of the first dummy channel hole 280Ha. In some embodiments, the insulation layer 282 may be formed to be thicker than the gate insulation layer 241. Next, the conductive layer 281 may be formed on the insulation layer 282, and thus the dummy channel structures 280 including the conductive layer 281 and the insulation layer 282 may be formed. The conductive layer 281 may fill the first dummy channel hole 280Ha and the second dummy channel hole 280Hb together with the insulation layer 282.

Referring to FIGS. 7E, 7F, and 4B together, a space 255H may be formed between the common source line layer 210 and the lower support layer 260 by removing the lower sacrificial layer 255. The gate insulation layer 241 of the channel structure 240 and the insulation layer 282 of the dummy channel structures 280 may be exposed in the space 255H. Before the removal of the lower sacrificial layer 255, the word line cut WSH, which penetrates through the first portion PSa and the second portion PSb of the preliminary stacked structures PS and the lower support layer 260 and exposes the lower sacrificial layer 255, may be formed. An etchant may reach the lower sacrificial layer 255 through the word line cut WSH and etch the lower sacrificial layer 255.

Referring to FIGS. 7F, 7G, and 4B together, a portion of the gate insulation layer 241 of the channel structure 240 exposed in the space 255H may be removed to form an opening 240P which penetrates through the gate insulation layer 241. The channel layer 242 may be exposed in the space 255H through the opening 240P. In some embodiments, the insulation layer 282 of the dummy channel structures 280 may have a thickness sufficient to not to be completely removed during the removal of a portion of the gate insulation layer 241 of the channel structure 240, and thus the conductive layer 281 may not be exposed in the space 255H. In another embodiment, the insulation layer 282 of the dummy channel structures 280 may be exposed to an etchant for removing a portion of the gate insulation layer 241 of the channel structure 240, and an exposed portion of the insulation layer 282 may be etched, thereby exposing the conductive layer 281 in the space 255H.

Referring to FIGS. 7G, 7H, and 4B together, the lower conductive layer 250 may be formed by filling the space 255H. The lower conductive layer 250 may contact the channel layer 242 through the opening 240P. In some embodiments, the lower conductive layer 250 may not be in contact with the conductive layer 281. In some other embodiments, unlike as shown in FIG. 7H, the lower conductive layer 250 may penetrate through the insulation layer 282 and contact the conductive layer 281.

Referring to FIGS. 7H and 7I, the first sacrificial layers 235a and the second sacrificial layers 235b may be removed to form a plurality of spaces 235Ha and 235Hb between the first interlayer insulation layers 220a and the second interlayer insulation layers 220b.

Referring to FIGS. 7I and 7J together, the gate layers 230a and 230b may be formed to fill the spaces 235Ha and 235Hb between the interlayer insulation layers 220a and 220b, respectively. In this way, the stacked structure SS including the first portion SSa, which includes the first interlayer insulation layers 220a and the first gate layers 230a alternately stacked on the common source line layer 210, and the second portion SSb, which includes the second interlayer insulation layers 220b and the second gate layers 230b alternately stacked on the first portion SSa, may be formed.

Referring to FIG. 7K, the first portion IL2a of the second insulation structure IL2 may be formed on the second portion IL2b of the second insulation structure 112 and the stacked structure SS, thereby completing the second insulation structure IL2 including the first portion IL2a, the second portion IL2b, and the third portion IL2c. The second interconnect structure IC2 may penetrate through the second insulation structure IL2 and to be connected to the gate layers 230a and 230b, the channel structures 240, and the dummy channel structures 280. The second bonding pads BP2 may be arranged on the second insulation structure IL2 and connected to the second interconnect structure IC2. In some embodiments, the top surface of the second bonding pad BP2 may be coplanar with the top surface of the second insulation structure IL2.

Referring to FIG. 7L together with FIGS. 6 and 7K, a result structure of FIG. 7K is turned upside down and bonded onto the first structure S1 shown in FIG. 6. For example, the result structure of FIG. 7K may be bonded onto the first structure S1, such that the second insulation structure IL2 faces toward the first insulation structure IL1 and the second bonding pads BP2 correspond to the first bonding pads BP1, respectively.

For example, the first insulation structure IL1 and the second insulation structure IL2 contacting each other may be bonded through a metal to metal bond, for example, a covalent bond. The first bonding pads BP1 and the second bonding pads BP2 corresponding to each other may expand by heat to come into contact with each other and may then be diffusion bonded to form an integral body through diffusion of metal atoms therein.

Referring to FIGS. 7L and 7M together, the second substrate 215 may be removed to expose the conductive etch stop layer 270 and the second insulation structure IL2, thereby completing the second structure S2 bonded onto the first structure S1. For example, after a wet etching process is performed to remove most of the second substrate 215 without exposing the conductive etch stop layer 270 and the second insulation structure IL2, a dry etching process for removing the remaining portion of the second substrate 215 may be performed, thereby removing the second substrate 215.

In the dry etching process for removing the remaining portion of the second substrate 215, the etching selectivity of the second substrate 215 with respect to the conductive etch stop layer 270 may be 300:1 or higher. In some embodiments, in the dry etching process for removing the remaining portion of the second substrate 215, the etch selectivity of the second substrate 215 with respect to the second insulation structure IL2 may be slightly lower than the etch selectivity of the second substrate 215 with respect to the conductive etch stop layer 270.

After the second substrate 215 is removed, the top surface of the conductive etch stop layer 270 may be at the first vertical level LV1, and the top surface of the second insulation structure IL2 may be at the second vertical level LV2 lower than the first vertical level LV1. The top surface of the second insulation structure IL2 may be at the second vertical level LV2 higher than the third vertical level LV3 at which the top surface of the conductive etch stop layer 270 is located. Accordingly, even after the second substrate 215 is removed, the common source line layer 210 may be covered by the second insulation structure IL2 and not exposed.

Referring to FIG. 7N, the third insulation structure IL3 covering the second insulation structure IL2 and the conductive etch stop layer 270, the input/output via 292 penetrating through the third insulation structure IL3, and the input/output pad 294 disposed on the third insulation structure IL3 and connected to the input/output via 292 are formed.

Thereafter, the fourth insulation structure IL4 and the external connection pad 296 shown in FIG. 4A may be formed, thereby forming the non-volatile memory device 100.

Referring to FIGS. 4A, 4B, 6, and 7A to 7N together, in the non-volatile memory device 100 according to the inventive concept, the conductive etch stop layer 270 is disposed between the second substrate 215 and the common source line layer 210, and thus generation of a high current by arcing due to accumulation of charges in the common source line layer 210 may be prevented during formation of the stacked structure SS on the second substrate 215. Therefore, the non-volatile memory device 100 may be prevented from being damaged by a high current, and thus the non-volatile memory device 100 may have increased reliability.

According to the method of manufacturing the non-volatile memory device 100 according to the inventive concept, since only the conductive etch stop layer 270 is included between the second substrate 215 and the common source line layer 210, a separate bypass structure for removing charges from the common source line layer 210 to prevent generation of a high current due to arcing is not needed, and accordingly, the number of steps in the process of manufacturing the non-volatile memory device 100 may be reduced. In order words, the process of manufacturing a non-volatile memory device according to the present inventive concepts may be simplified, have reduced time, and/or have reduced cost(s). Also, according to the method of manufacturing the non-volatile memory device 100 according to the inventive concept, the conductive etch stop layer 270 may serve as an etch stop layer when the second substrate 215 is removed, thereby facilitating removal of the second substrate 215.

FIGS. 8A to 8L are cross-sectional diagrams for describing a method of manufacturing a non-volatile memory device according to example embodiments of the inventive concept.

Figure 8A:
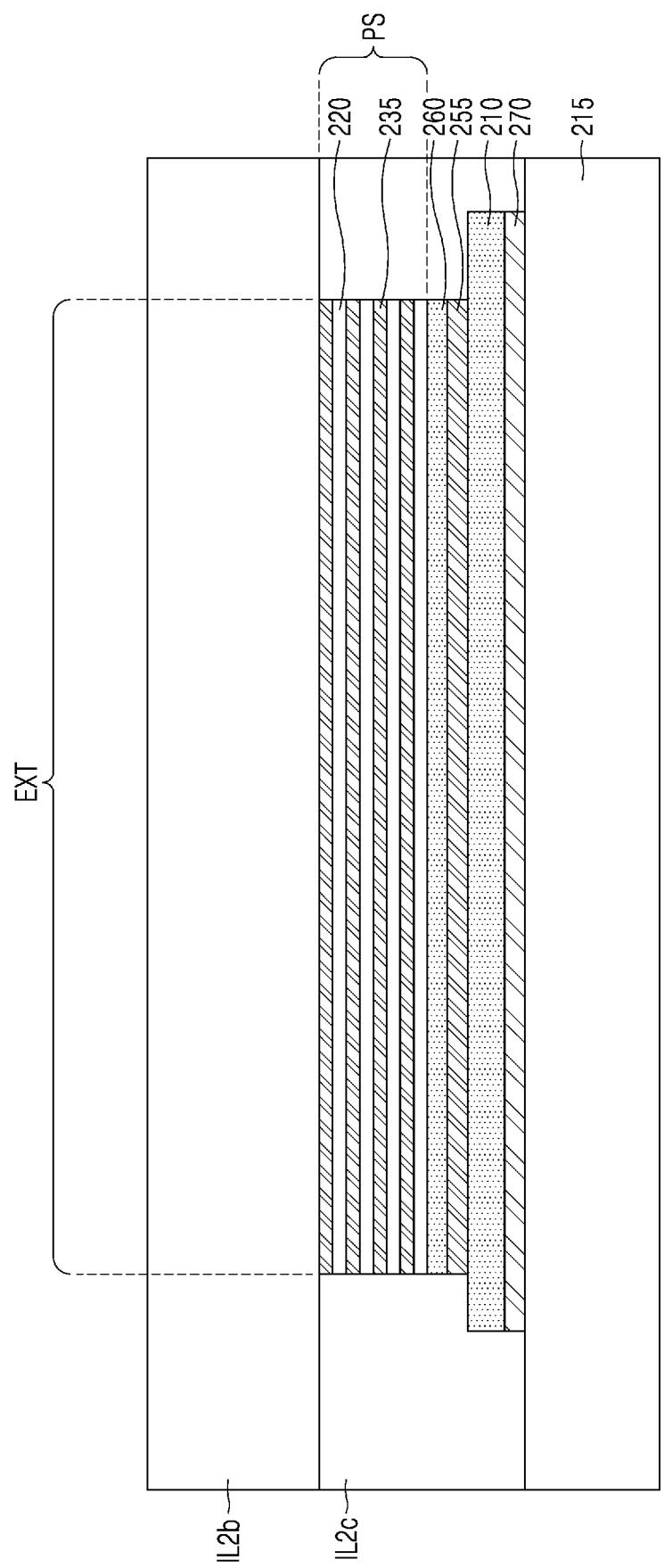
FIGS. 8A to 8L are cross-sectional diagrams for describing a method of manufacturing a non-volatile memory device according to example embodiments of the inventive concept.

Referring to FIG. 8A, according to the operations described with reference to FIGS. 7A to 7D, the conductive etch stop layer 270 on the second substrate 215, the common source line layer 210, the lower sacrificial layer 255 on the common source line layer 210, the lower support layer 260 on the lower sacrificial layer 255, the preliminary stacked structure PS on the lower support layer 260, the channel structure 240 (refer to FIG. 7D) penetrating through the preliminary stacked structure PS, the third portion IL2c of the second insulation structure on the second substrate 215, and the second portion IL2b of the second insulation structure on the third portion IL2c of the second insulation structure and the preliminary stacked structure PS may be formed. According to different embodiments, the first dummy channel structures 280 (refer to FIG. 7E) may not be formed, may be formed to have the same structure as that of the channel structure 240, or may be formed as shown in FIG. 7E. The preliminary stacked structure PS may include a plurality of interlayer insulation layers 220 and a plurality of sacrificial layers 235 alternately stacked on the lower support layer 260.

In some embodiments, the stepped region EXT of the preliminary stacked structure PS may be patterned to have a stepped shape according to the operations described above with reference to FIGS. 7A to 7D. The interlayer insulation layers 220 may be the interlayer insulation layers 220a and 220b shown in FIGS. 7B to 7D, and the sacrificial layers 235 may be the first sacrificial layers 235a and the second sacrificial layers 235b shown in FIGS. 7B to 7D.

Figure 8B:
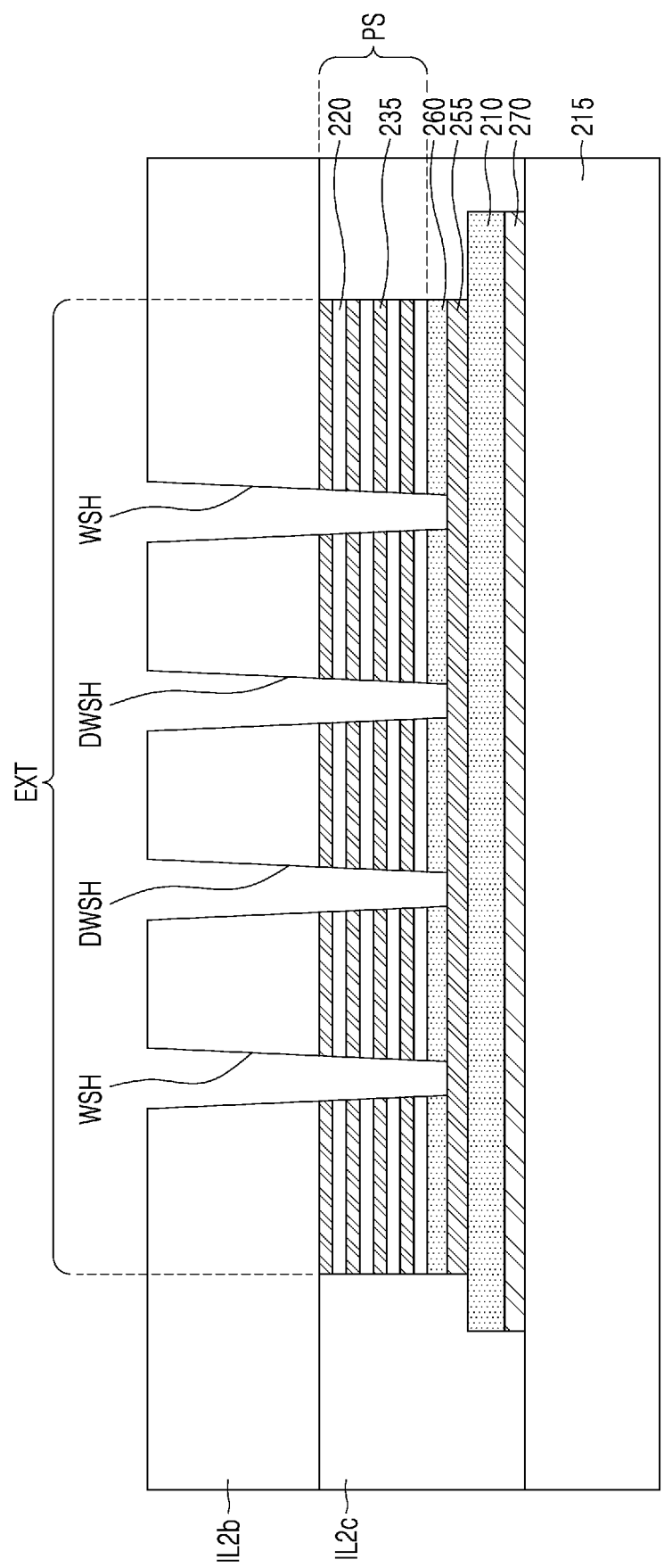

Referring to FIG. 8B, the word line cut WSH and the dummy word line cut DWSH penetrating the lower support layer 260, the preliminary stacked structure PS, and the second portion IL2b of the second insulation structure and exposing the lower sacrificial layer 255 may be formed.

Figure 8C:
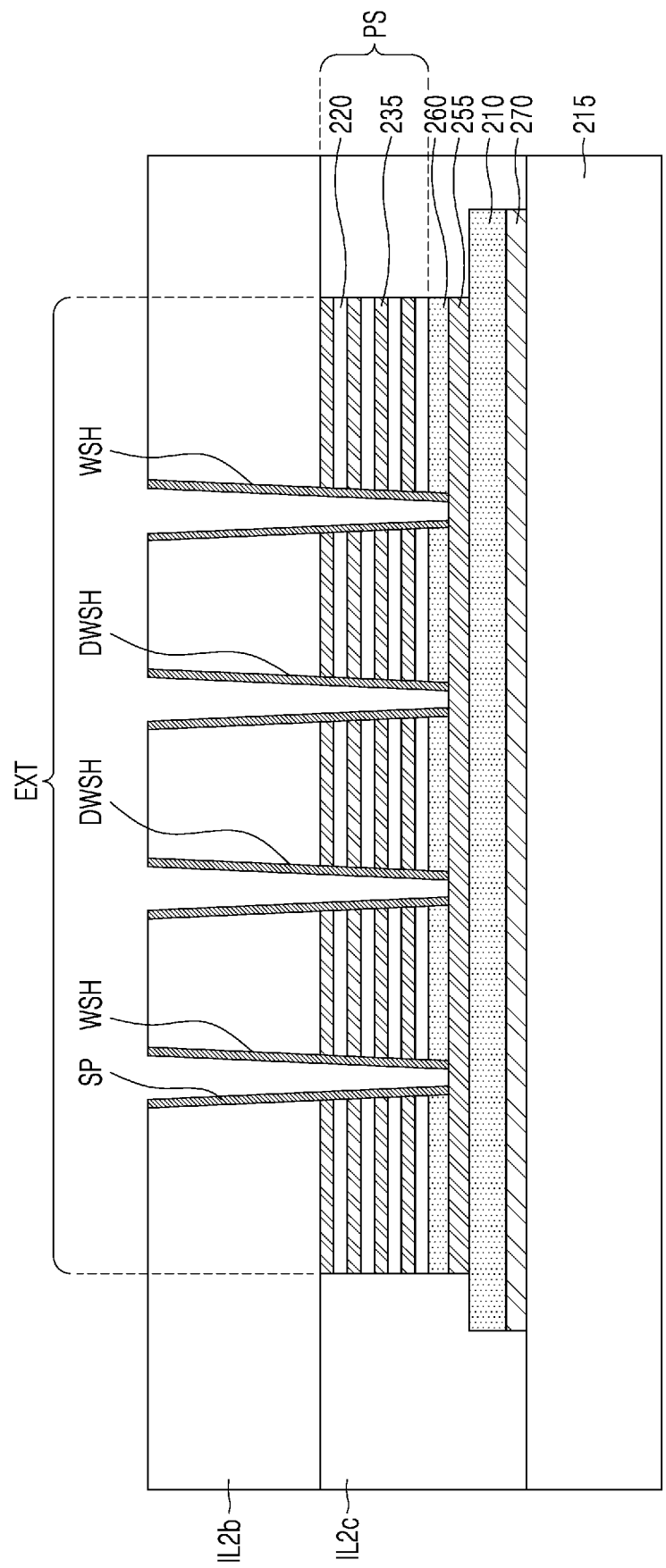

Referring to FIG. 8C, spacer layers SP may be formed on inner walls of the word line cut WSH and on inner walls of the dummy word line cut DWSH. For example, the spacer layers SP may be formed on the inner walls and bottom surfaces of the word line cut WSH and on the inner walls and bottom surfaces of the dummy word line cut DWSH and on the top surface of the second portion IL2b of the second insulation structure, and portions of the spacer layers SP on the bottom surfaces of the word line cut WSH and the dummy word line cut DWSH and the top surface of the second portion IL2b of the second insulation structure may be removed by anisotropically etching the spacer layers SP.

Figure 8D:
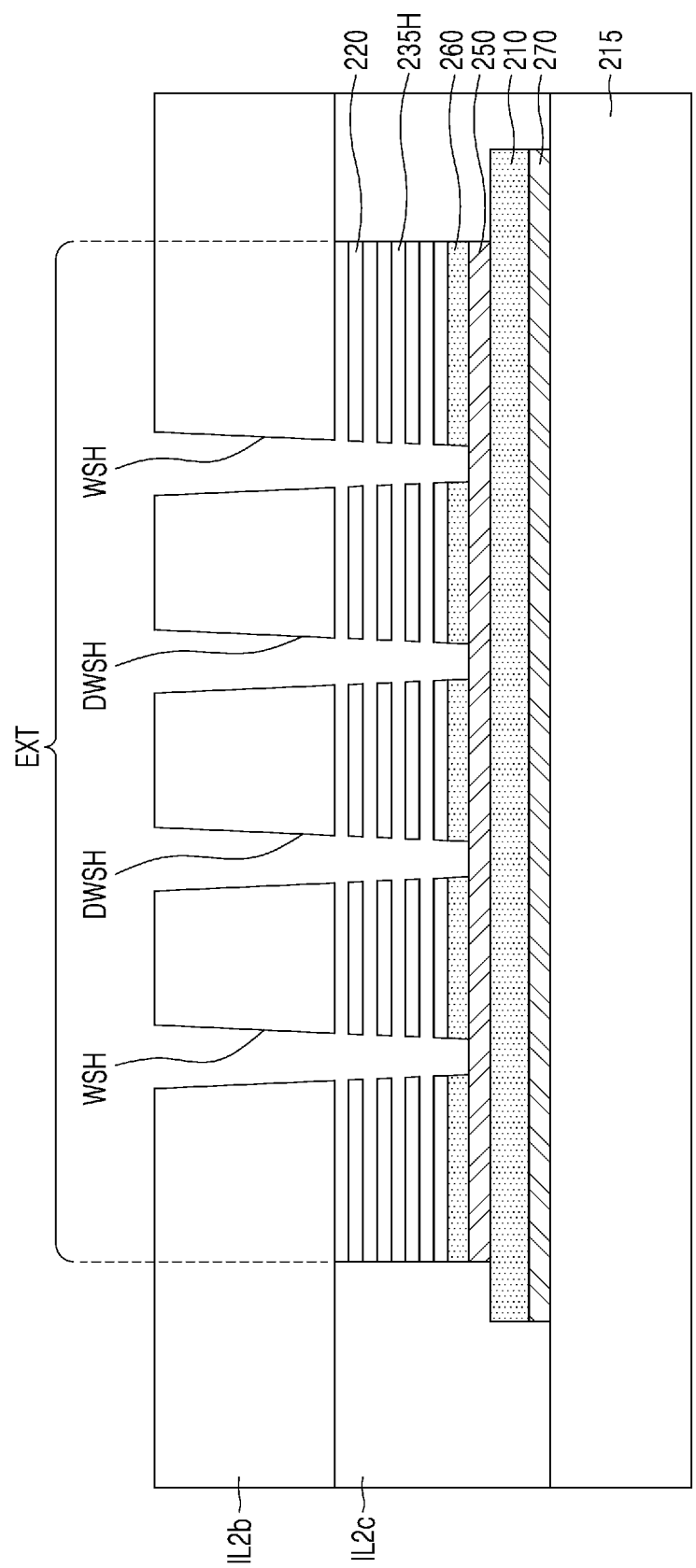

Referring to FIGS. 8C and 8D together, the lower sacrificial layer 255 may be removed. As shown in FIG. 7G, the gate insulation layer 241 may be etched to expose the channel layer 242. Next, a space formed by removing the lower sacrificial layer 255 may be filled by the lower conductive layer 250. Next, the spacer layers SP may be removed from the inner walls of the word line cut WSH and the dummy word line cut DWSH. Next, a plurality of spaces 235H between the interlayer insulation layers 220 may be formed by removing the sacrificial layers 235.

Figure 8E:
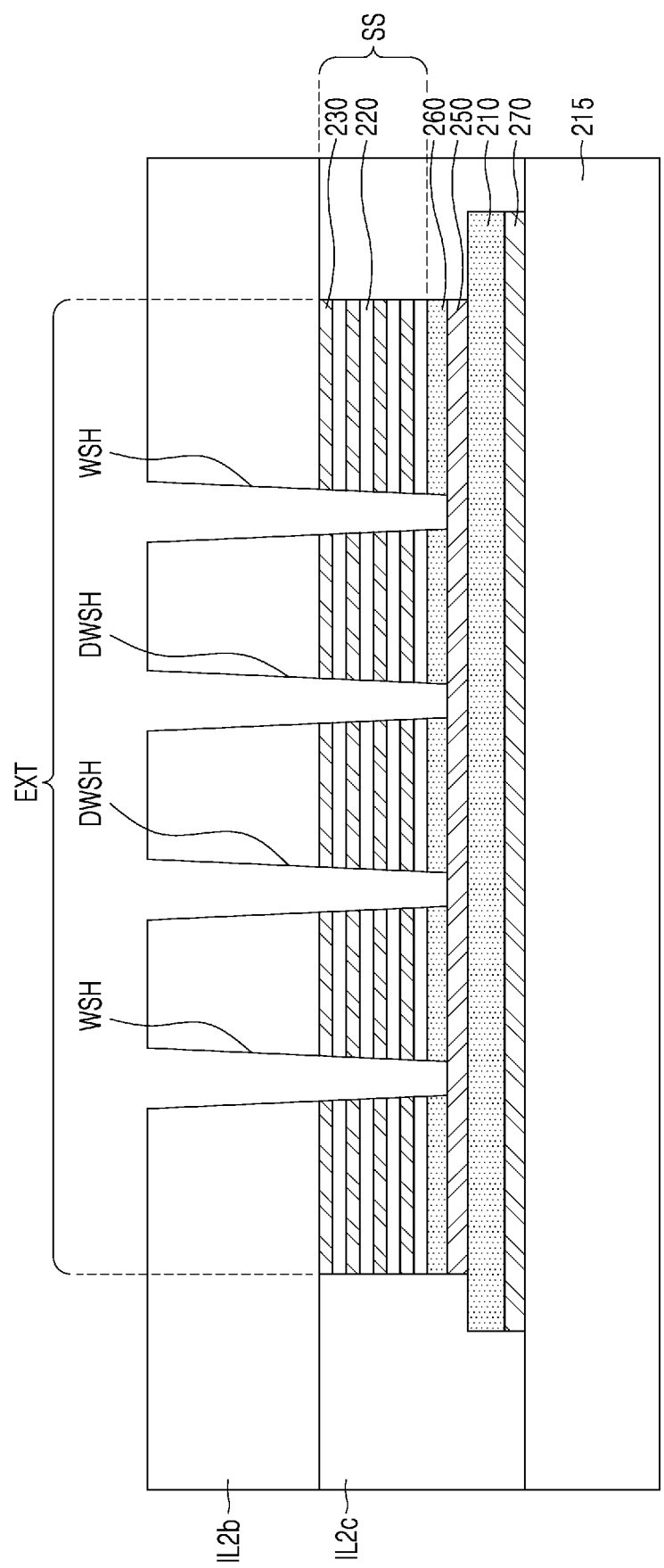

Referring to FIGS. 8D and 8E together, a plurality of gate layers 230 may fill the spaces 235IH between the interlayer insulation layers 220. In this way, the stacked structure SS including the gate layers 230 and the interlayer insulation layers 220 alternately stacked on the lower support layer 260 may be completed.

Figure 8F:
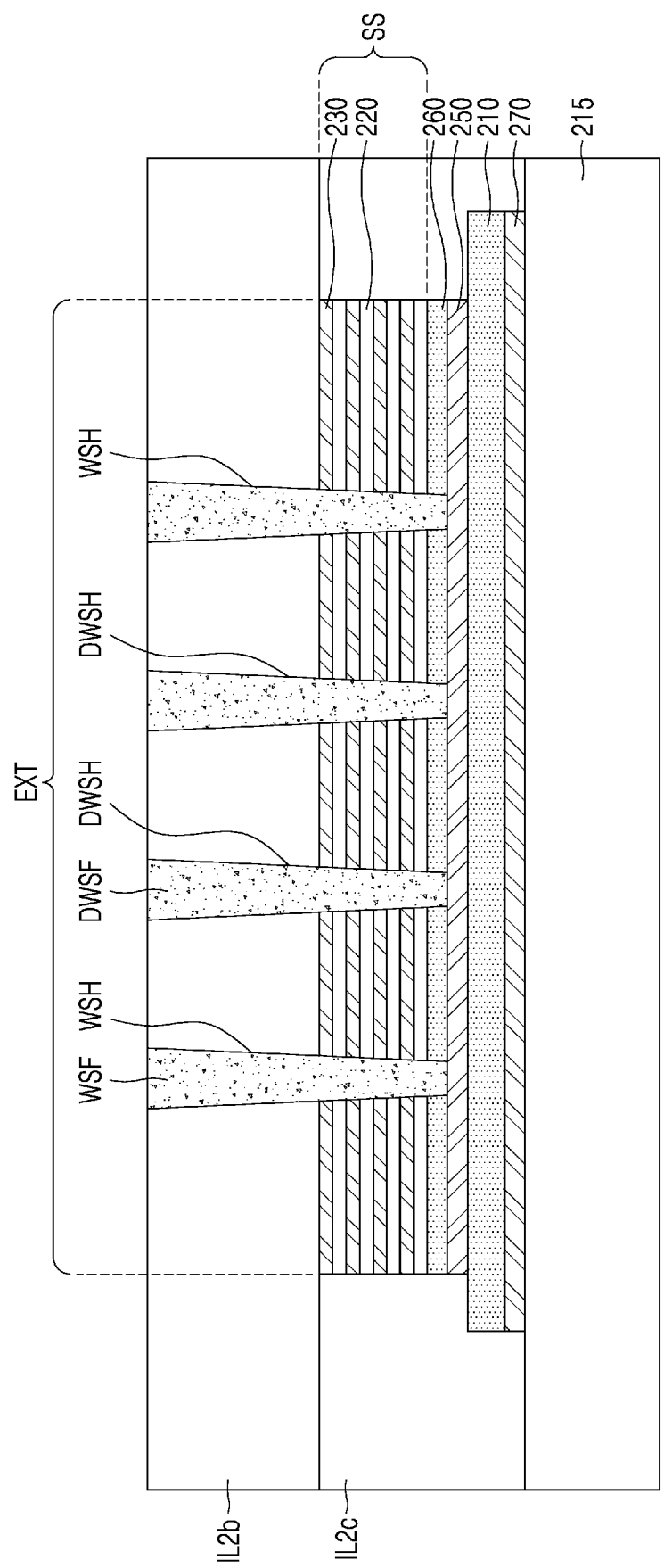

Referring to FIG. 8F, a filling layer WSF and a dummy filling layer DWSF may fill the word line cut WSH and the dummy word line cut DWSH, respectively. In some embodiments, the filling layer WSF and the dummy filling layer DWSF may include polysilicon.

Figure 8G:
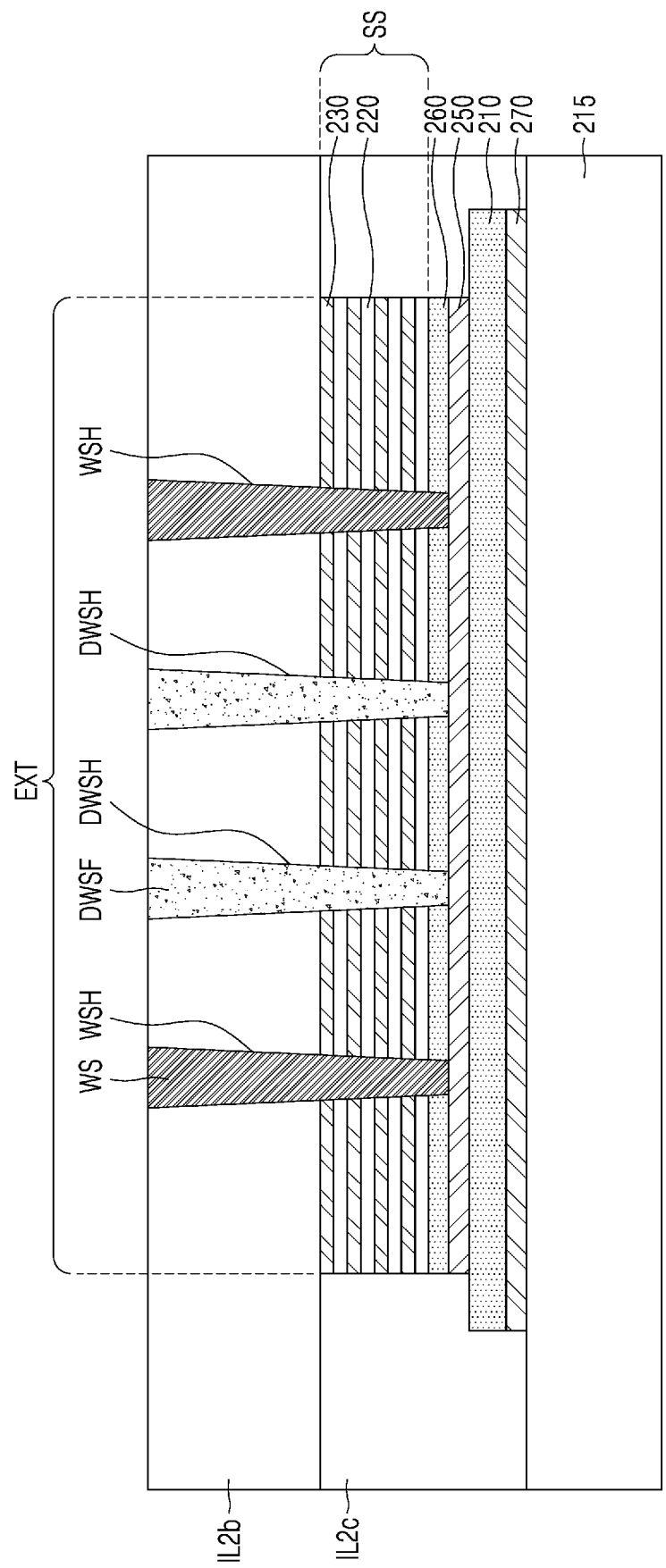

Referring to FIGS. 8F and 8G together, the filling layer WSF is removed from the word line cut WSH. To prevent the dummy filling layer DWSF from being removed, a mask that covers the dummy filling layer DWSF and exposes the filling layer WSF may be formed before the removal of the filling layer WSF. The mask may be removed after the filling layer WSF is removed. After the filling layer WSF is removed, the word line cut structure WS may be formed in the word line cut WSH.

Figure 8H:
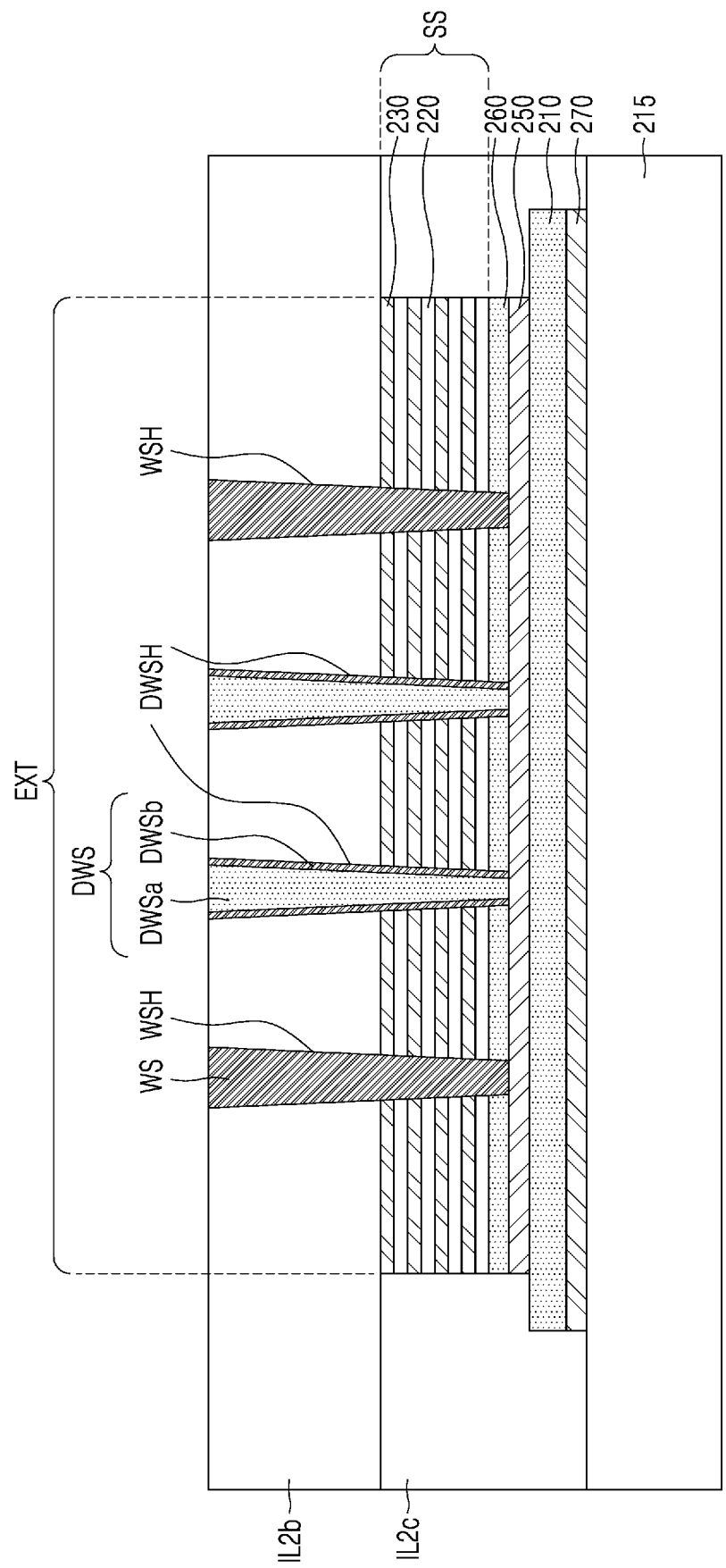

Referring to FIGS. 8G and 8H, the dummy filling layer DWSF is removed from the dummy word line cut DWSH. Next, the insulation layer DWSb may be formed on the inner wall of the dummy word line cut DWSH. For example, the insulation layer DWSb may be formed on the inner wall and on the bottom surface of the dummy word line cut DWSH and, in some embodiments, on the top surface of the second portion IL2b of the second insulation structure, and portions of the insulation layer DWSb on the bottom surface of the dummy word line cut DWSH and the top surface of the second portion 112b of the second insulation structure may then be removed by anisotropically etching the insulation layer DWSb. Next, the conductive layer DWSa may be formed on the insulation layer DWSb. The conductive layer DWSa may fill the dummy word line cut DWSH together with the insulation layer DWSb.

Figure 8I:
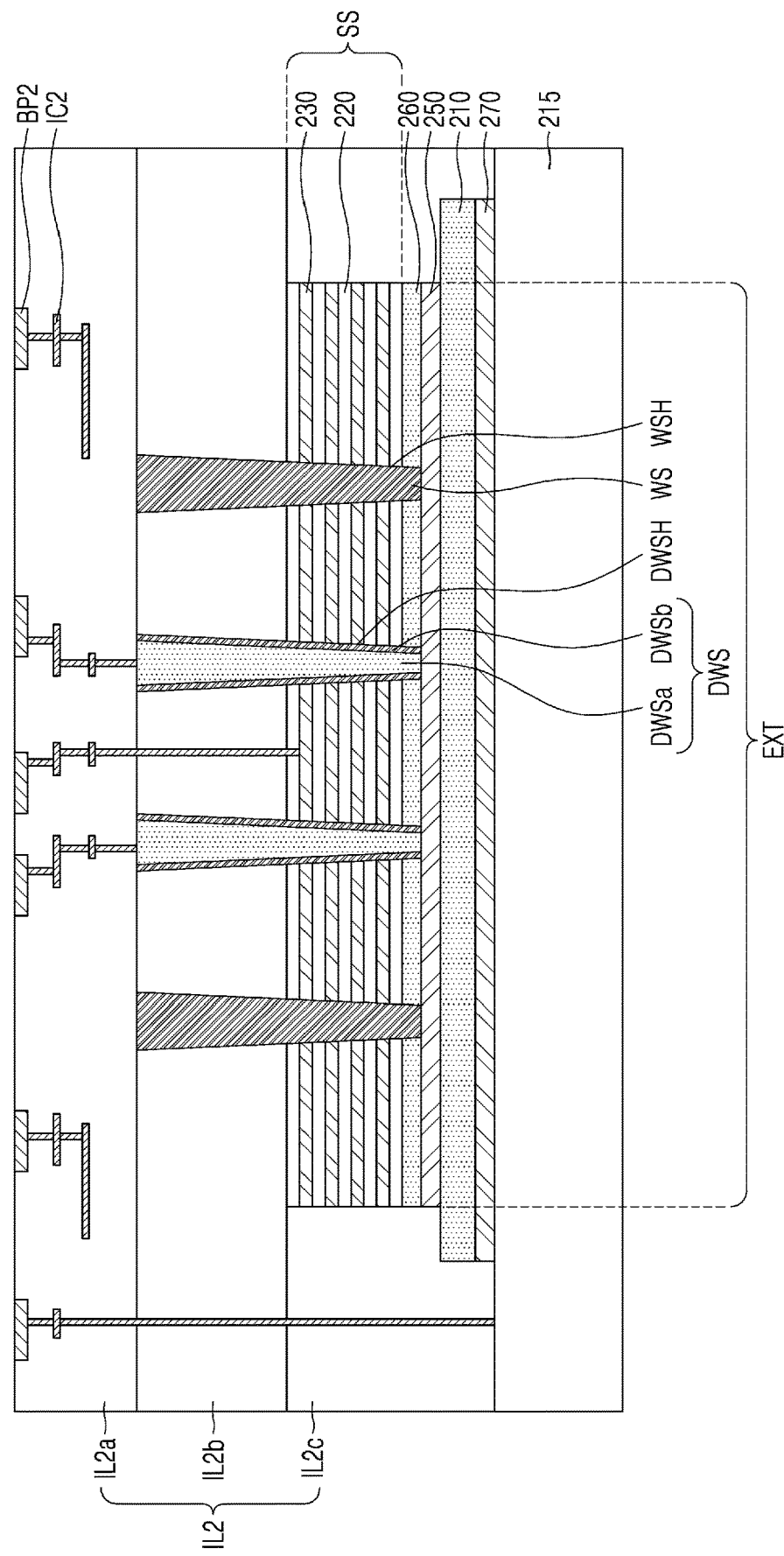

Referring to FIG. 8I, the first portion IL2a of the second insulation structure, the second interconnect structure IC2, and the second bonding pads BP2 may be formed. In this way, the second insulation structure IL2 including the first portion IL2a, the second portion IL2b, and the third portion IL2c may be completed.

Referring to FIG. 83 together with FIGS. 6 and 8I, a result structure of FIG. 8I is turned upside down and bonded onto the first structure S1 shown in FIG. 6.

Figure 8J:
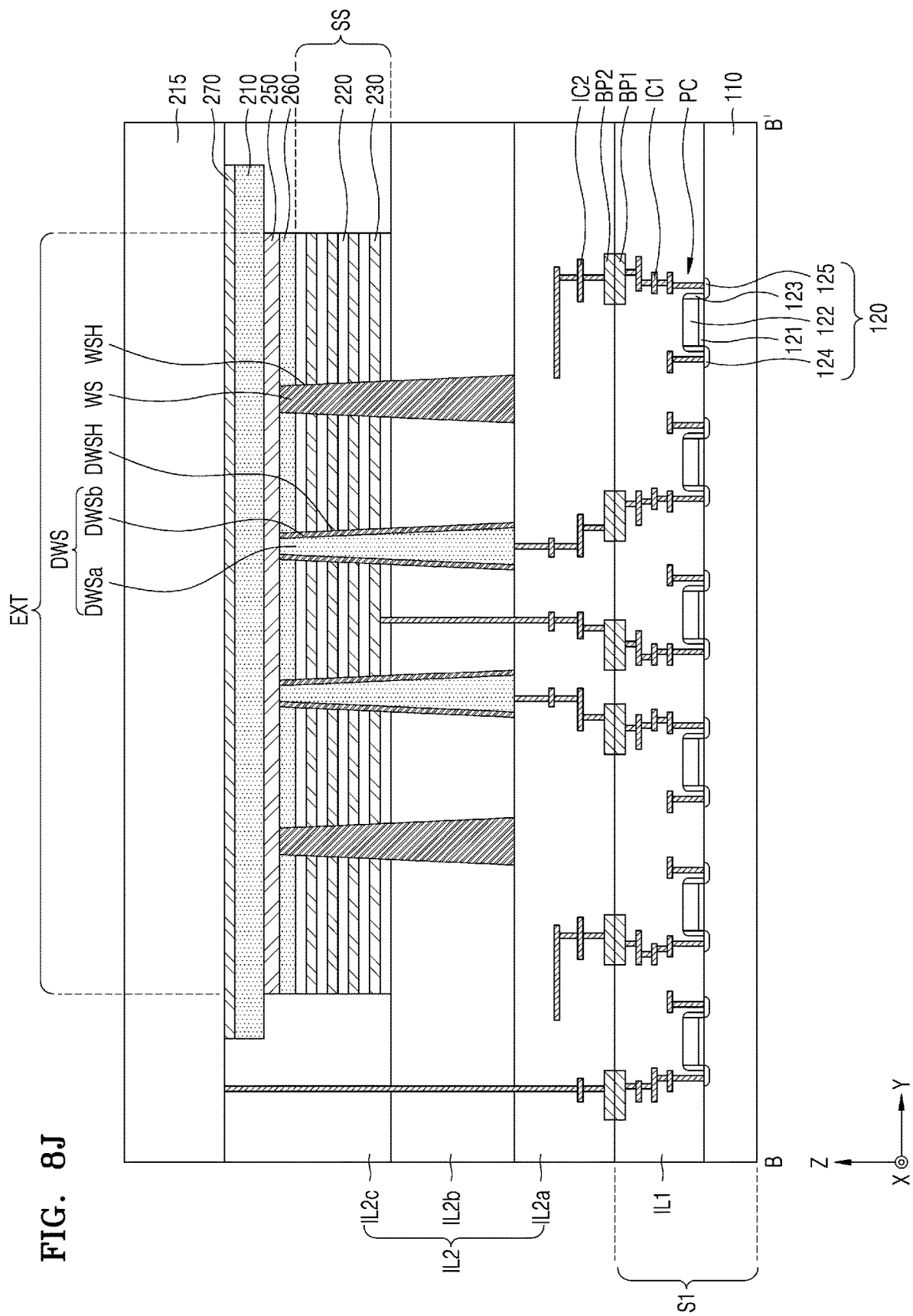
Figure 8K:
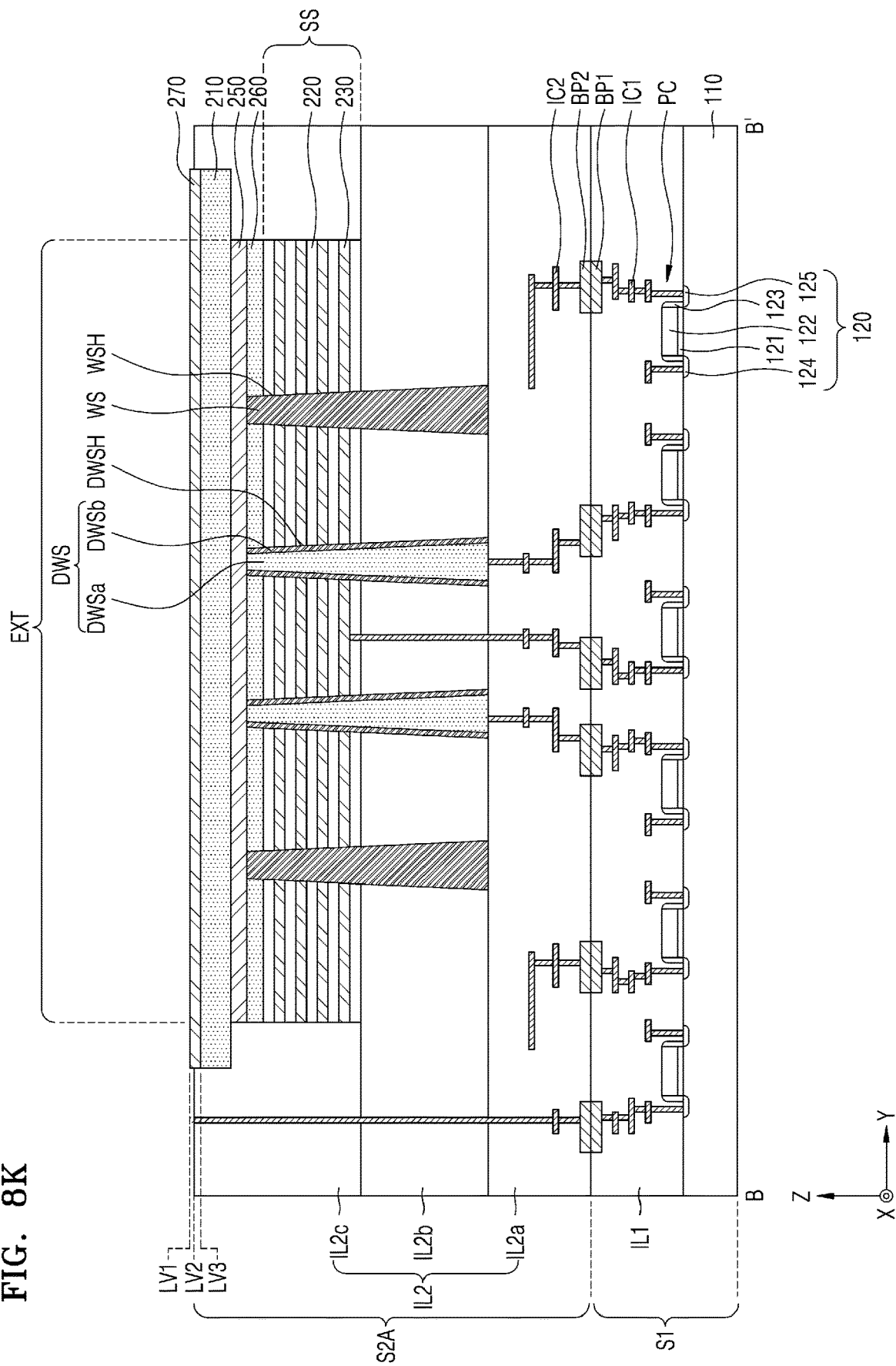

Referring to FIGS. 8J and 8K together, the second substrate 215 may be removed to expose the conductive etch stop layer 270 and the second insulation structure IL2, thereby completing the second structure S2 bonded onto the first structure S1. After the second substrate 215 is removed, the top surface of the conductive etch stop layer 270 may be at the first vertical level LV1 (e.g., disposed at the first vertical level LV1), and the top surface of the second insulation structure IL2 may be at the second vertical level LV2 lower than the first vertical level LV1. The top surface of the second insulation structure IL2 may be at the second vertical level LV2 higher than the third vertical level LV3 at which the top surface of the conductive etch stop layer 270 is located. Accordingly, even after the second substrate 215 is removed, the common source line layer 210 may be covered by the second insulation structure IL2 and not exposed.

Figure 8L:
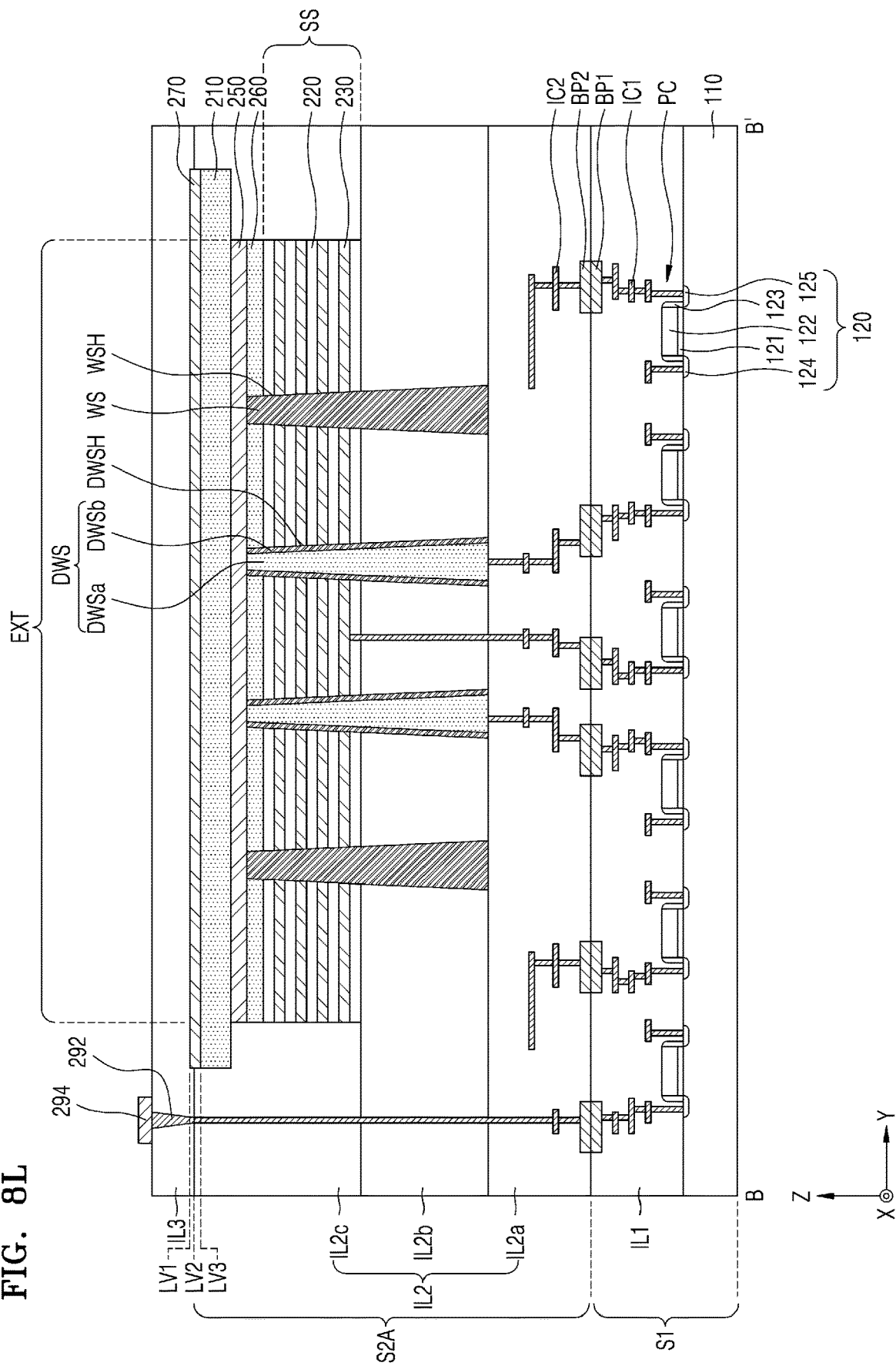

Referring to FIG. 8L, the third insulation structure IL3 covering the second insulation structure IL2 and the conductive etch stop layer 270, the input/output via 292 penetrating through the third insulation structure IL3, and the input/output pad 294 disposed on the third insulation structure IL3 and connected to the input/output via 292 are formed.

Thereafter, the fourth insulation structure IL4 and the external connection pad 296 shown in FIG. 5B may be formed, thereby forming the non-volatile memory device 100A.

Figure 9:
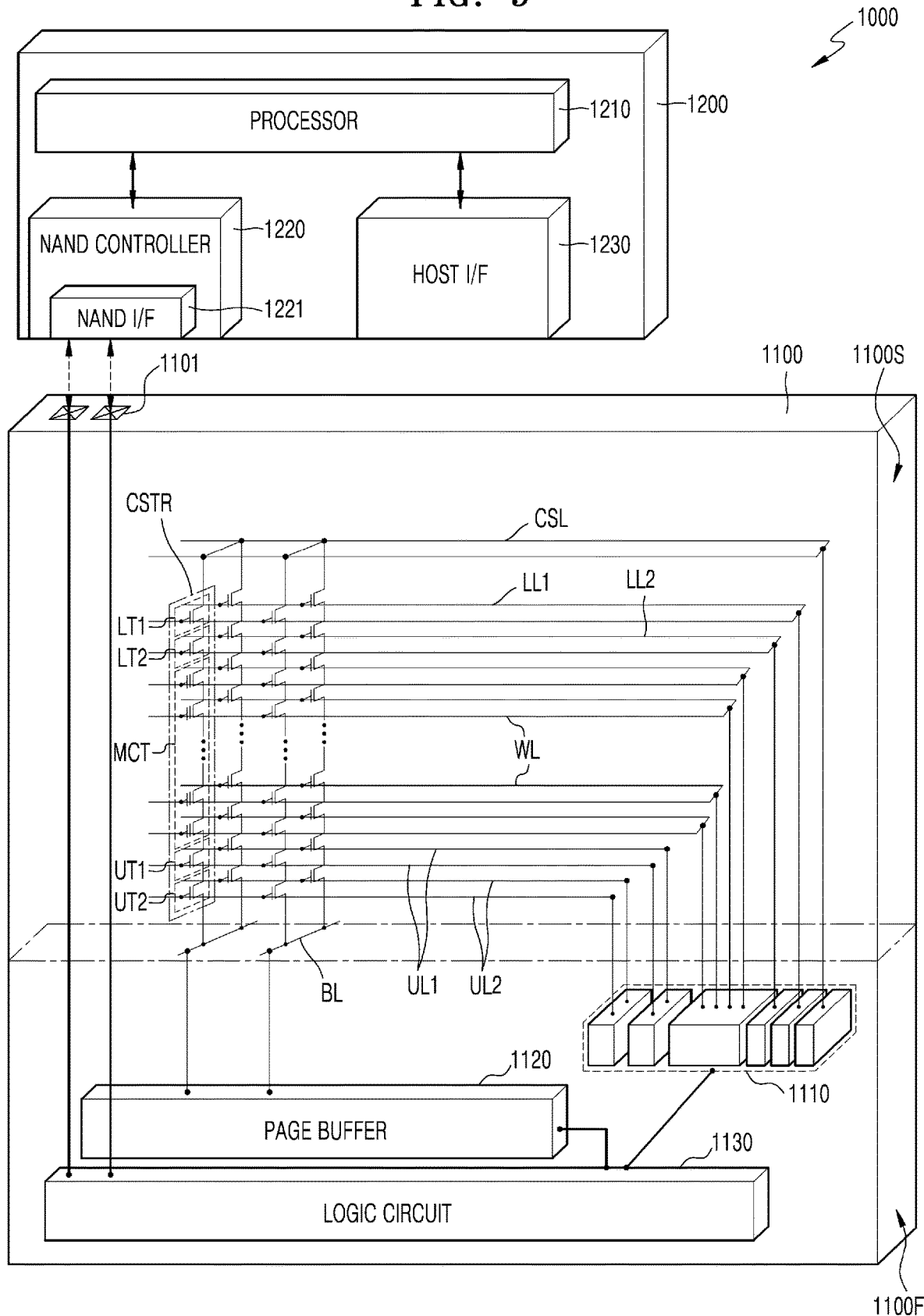
FIG. 9 is a schematic view of a memory system including a non-volatile memory device according to example embodiments of the inventive concept.

FIG. 9 is a schematic view of a memory system including a non-volatile memory device according to example embodiments of the inventive concept.

Referring to FIG. 9, a memory system 1000 may include one or more memory devices 1100 and a memory controller 1200 electrically connected to the one or more memory devices 1100. The memory system 1000 may be, for example, a solid state drive (SSD) device, a universal serial bus (USB), a computing system, a medical device, or a communication device including at least one memory device 1100.

A memory device 1100 may be a non-volatile memory device. For example, the memory device 1100 may be a NAND flash memory device including one of the non-volatile memory devices 100 and 100A described above with reference to FIGS. 4A to 5B, or a combination thereof. The memory device 1100 may include a first structure 1100F and a second structure 1100S disposed on the first structure 1100F. The first structure 11001F may correspond to the first structure S1 shown in FIGS. 4A and 5B. The peripheral circuit PC shown in FIGS. 4A and 5B may include a row decoder 1110, a page buffer 1120, and a logic circuit 1130.

The second structure 1100S may correspond to the second structures S2 and S2A shown in FIGS. 4A and 5B. The second structure 1100S may include a plurality of bit lines BL, a common source line CSL, a plurality of word lines WL, first and second string select lines UL1 and UL2, first and second ground select lines LL1 and LL2, and a plurality of memory cell strings CSTR between the bit lines BL and the common source line CSL. The second interconnect structure IC2 shown in FIGS. 4A and 5B may include a bit line BL, a word line WL, string select lines UL1 and UL2, and ground select lines LL1 and LL2. The channel structure 240 and gate layers 230a, 230b, and 230 shown in FIGS. 4A and 5B may constitute the memory cell strings CSTR. The common source line layer 210 and the conductive etch stop layer 270 shown in FIGS. 4A and 5B may correspond to the common source line CSL.

In the second structure 1100S, the memory cell strings CSTR may each include ground select transistors LT1 and LT2 adjacent to the common source line CSL, string select transistors UT1 and UT2 adjacent to the bit lines BL, and a plurality of memory cell transistors MCT between the ground select transistors LT1 and LT2 and the string select transistors UT1 and UT2. The number of ground select transistors LT1 and LT2 and the number of string select transistors UT1 and UT2 may be variously changed according to embodiments. The channel structure 240 and one gate layer from among the gate layers 230a, 230b, and 230 shown in FIGS. 4A and 5B may constitute one of transistors LT1, LT2, UT1, UT2, and MCT.

In example embodiments, the first and second ground select lines LL1 and LL2 may be connected to gate electrodes of the ground select transistors LT1 and LT2, respectively. A word line WL may be connected to a gate electrode of a memory cell transistor MCT. The first and second string select lines UL1 and UL2 may be connected to gate electrodes of the string select transistors UT1 and UT2, respectively.

The common source line CSL, the ground select lines LL1 and LL2, the word lines WL, and the first and second string select lines UL1 and UL2 may be connected to a row decoder 1110. The bit lines BL may be electrically connected to a page buffer 1120.

The memory device 1100 may communicate with the memory controller 1200 through external connection pads 1101 electrically connected to a logic circuit 1130. The external connection pads 1101 may be electrically connected to the logic circuit 1130. An external connection pad 1101 may be the input/output pads 294 or the external connection pad 296 shown in FIGS. 4A and 5B.

The memory controller 1200 may include a processor 1210, a NAND controller 1220, and a host interface 1230. In some embodiments, the memory system 1000 may include a plurality of memory devices 1100. In this case, the memory controller 1200 may control the memory devices 1100.

The processor 1210 may control the overall operation of the memory system 1000, including operations of the memory controller 1200. The processor 1210 may operate according to a firmware, and may access the memory device 1100 by controlling the NAND controller 1220. The NAND controller 1220 may include a NAND interface 1221 that handles communication with the memory device 1100.

Control commands for controlling the memory device 1100, data to be written to the memory cell transistors MCT of the memory device 1100, and data to be read from the memory cell transistors MCT of the memory device 1100 may be transmitted through the NAND interface 1221. The host interface 1230 may provide communication functionality between the memory system 1000 and an external host. When a control command is received from an external host through the host interface 1230, the processor 1210 may control the memory device 1100 in response to the control command.

Figure 10:
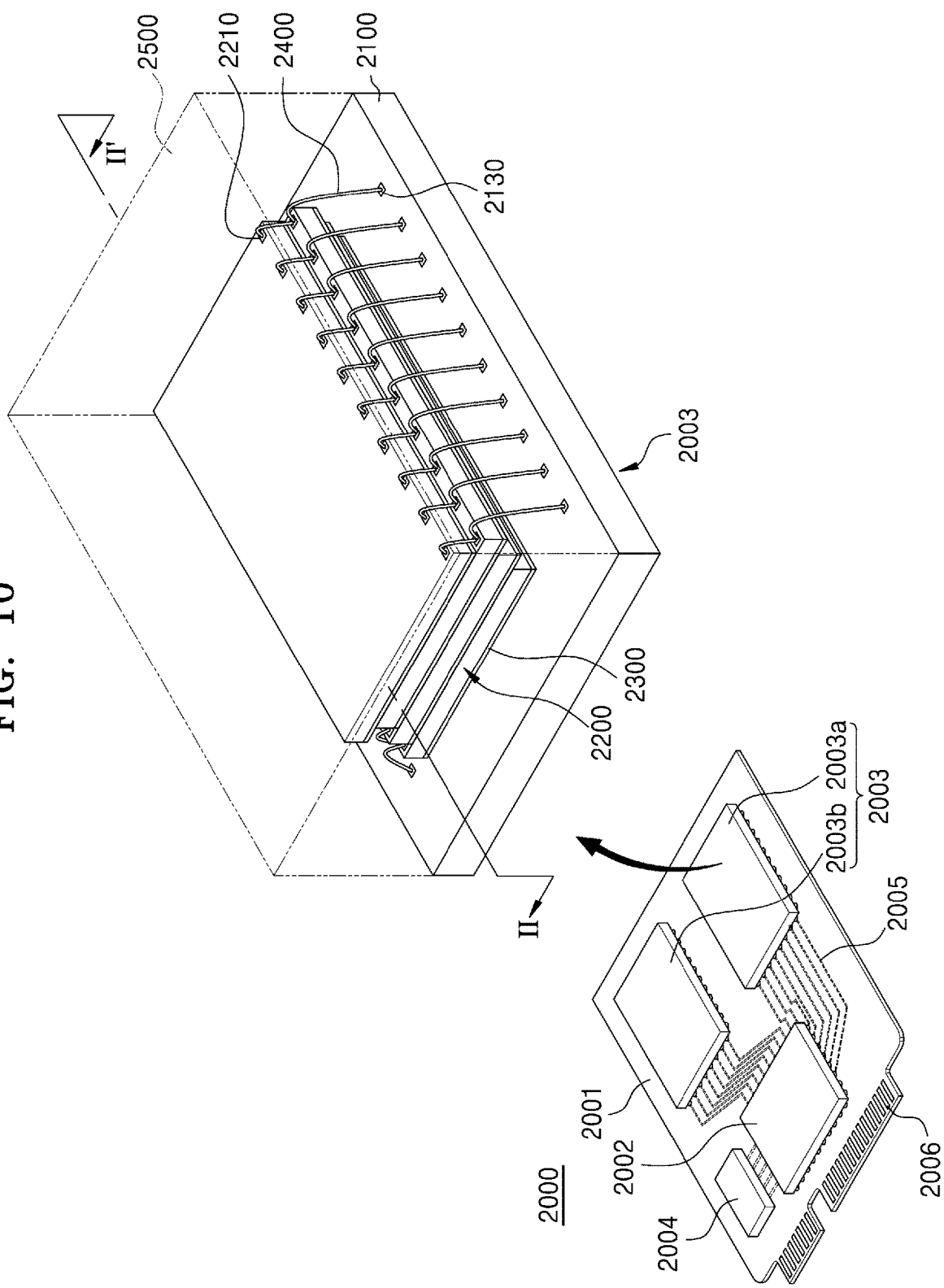
FIG. 10 is a schematic perspective view of a memory system including a non-volatile memory device according to example embodiments of the inventive concept.

FIG. 10 is a schematic perspective view of a memory system including a non-volatile memory device according to example embodiments of the inventive concept.

Referring to FIG. 10, a memory system 2000 according to an example embodiment of the inventive concept includes a main board 2001, a memory controller 2002 mounted on the main board 2001, one or more semiconductor packages 2003, and DRAM 2004 may be included. The semiconductor package 2003 and the DRAM 2004 may be connected to the memory controller 2002 by a plurality of wiring patterns 2005 formed on the main substrate 2001.

The main substrate 2001 may include a connector 2006 including a plurality of pins configured to be coupled to an external host. The number and arrangement of the pins of the connector 2006 may vary according to a communication interface between the memory system 2000 and the external host. In example embodiments, the memory system 2000 may communicate with an external host according to any one of interfaces including a universal serial bus (USB), peripheral component interconnect express (PCI-Express), serial advanced technology attachment (SATA), M-Phy for universal flash storage (UFS), etc. In example embodiments, the memory system 2000 may operate by power supplied from an external host through the connector 2006. The memory system 2000 may further include a power management integrated circuit (PMIC) that distributes power supplied from the external host to the memory controller 2002 and the semiconductor package 2003.

The memory controller 2002 may write data to or read data from the semiconductor package 2003 and may increase the operating speed of the memory system 2000.

The DRAM 2004 may be a buffer memory for mitigating a speed difference between the semiconductor package 2003, which is a data storage space, and an external host. The DRAM 2004 included in the memory system 2000 may also operate as a type of cache memory and may provide a space for temporarily storing data in a control operation for the semiconductor package 2003. When the DRAM 2004 is included in the memory system 2000, the memory controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may each be a semiconductor package including a plurality of semiconductor chips 2200. The first and second semiconductor packages 2003a and 2003b may each include a package substrate 2100, the semiconductor chips 2200 disposed on the package substrate 2100, an adhesive layer 2300 disposed on the bottom surface of each of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including a plurality of package upper pads 2130. The semiconductor chips 2200 may each include input/output pads 2210. The input/output pad 2210 may correspond to the input/output pad 294 or the external connection pad 296 of FIGS. 4A and 5B. The semiconductor chips 2200 may each include at least one of the non-volatile memory devices 100 and 100A described with reference to FIGS. 4 to 5, or a non-volatile memory device with a combination of features from the non-volatile memory devices 100 and/or 100A.

In example embodiments, the connection structure 2400 may be a bonding wire electrically connecting the input/output pad 2210 and the package upper pad 2130. Therefore, in the first and second semiconductor packages 2003*a* and 2003*b*, the semiconductor chips 2200 may be electrically connected to one another through bonding wires and may be electrically connected to the package upper pads 2130 of the package substrate 2100. In example embodiments, in the first and second semiconductor packages 2003*a* and 2003*b*, the semiconductor chips 2200 may be connected to one another through a connection structure including through silicon vias (TSVs) instead of or in addition to the connection structure 2400 including bonding wires.

In example embodiments, the memory controller 2002 and the semiconductor chips 2200 may be included in one package. In an example embodiment, the memory controller 2002 and the semiconductor chips 2200 may be mounted on a separate interposer substrate different from the main substrate 2001, and in such cases, the memory controller 2002 and the semiconductor chips 2200 may be connected to each other through wires formed on the interposer substrate.

Figure 11:
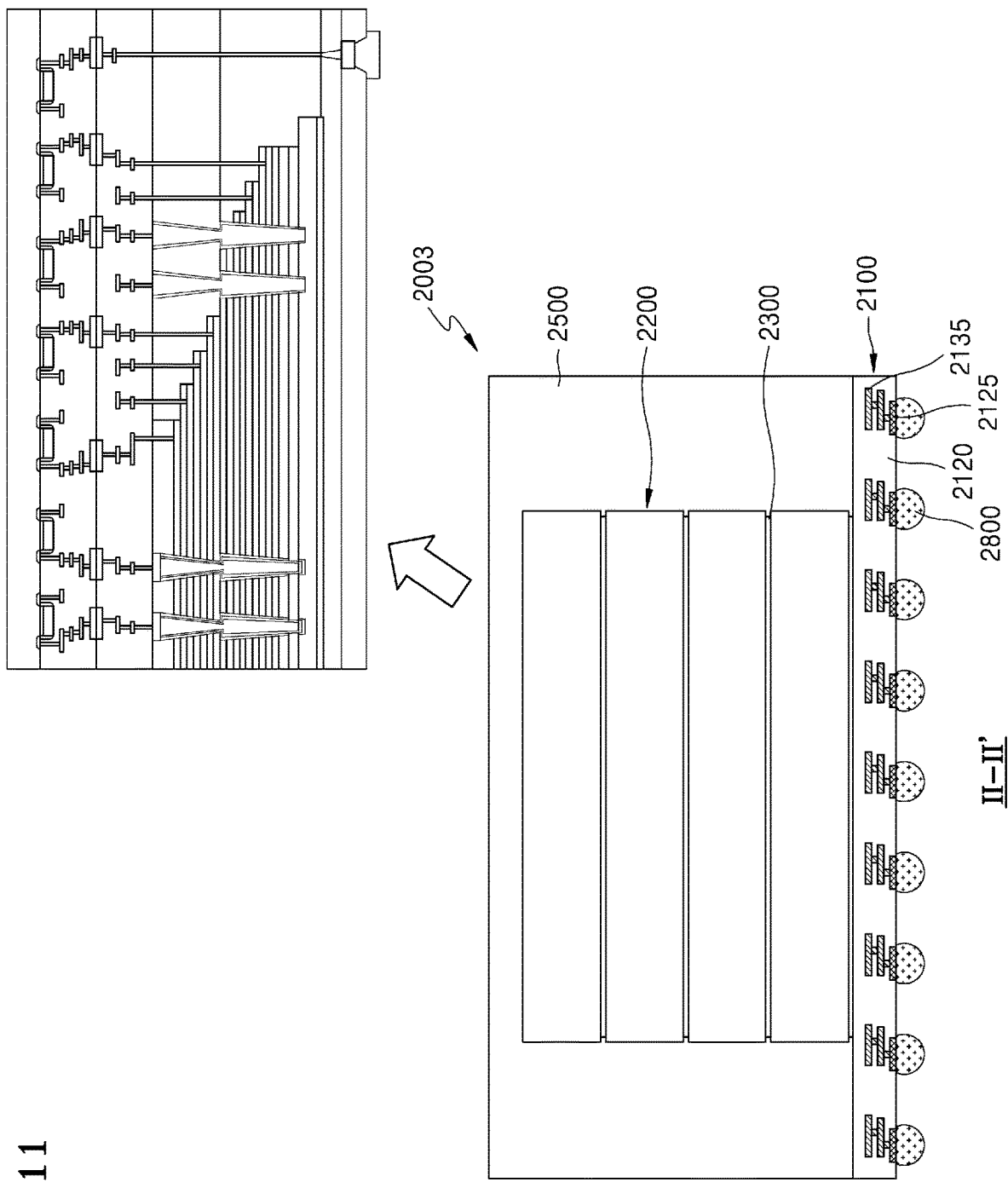
FIG. 11 is a schematic cross-sectional view of a semiconductor package according to example embodiments of the inventive concept.

FIG. 11 is a schematic cross-sectional view of a semiconductor package according to example embodiments of the inventive concept.

Referring to FIG. 11, in a semiconductor package 2003, the package substrate 2100 may be a printed circuit board. The package substrate 2100 may include a package substrate body 2120, a plurality of package upper pads 2130 (refer to FIG. 10) arranged on the top surface of the package substrate body 2120, a plurality of package lower pads 2125 arranged or exposed on the bottom surface of the package substrate body 2120, and a plurality of internal wires 2135 electrically connecting the package upper pads 2130 (refer to FIG. 10) and the package lower pads 2125 inside the package substrate body 2120. As shown in FIG. 10, the package upper pads 2130 may be electrically connected to the connection structures 2400. The lower pads 2125 may be connected to the wiring patterns 2005 on the main substrate 2001 of the memory system 2000 shown in FIG. 10 through a plurality of conductive bumps 2800. The semiconductor chips 2200 may each include the non-volatile memory devices 100 and 100A or features therefrom as described with reference to FIGS. 4A to 5B.

Accordingly, embodiments of the inventive concept provide a non-volatile memory device that does not require a separate common source line contact or bypass structure to prevent the accumulation of charges in a common source line. In this way, a non-volatile memory device according to the present disclosure may have reduced planar area, a simplified manufacturing process, and increased reliability.

While the inventive concept has been particularly shown and described with reference to embodiments thereof, it will be understood that various changes in form and details may be made therein without departing from the spirit and scope of the following claims.

What is claimed is:

1. A non-volatile memory device comprising:
a first structure;
a second structure; and
a connection layer,
wherein the first structure comprises: a first substrate; a peripheral circuit disposed on the first substrate; a first insulation structure disposed on the first substrate; a plurality of first bonding pads disposed on the first insulation structure; and a first interconnect structure surrounded by the first insulation structure, wherein the first interconnect structure electrically connects the peripheral circuit to the first bonding pads;
wherein the second structure comprises: a conductive etch stop layer; a common source line layer disposed on the conductive etch stop layer; a stacked structure including a plurality of gate layers and a plurality of interlayer insulation layers, wherein gate layers of the plurality of gate layers are alternately stacked with interlayer insulation layers of the plurality of interlayer insulation layers on the common source line layer; a plurality of channel structures penetrating through a cell region of the stacked structure and contacting the common source line layer; a second insulation structure disposed on the stacked structure; a plurality of second bonding pads disposed on the second insulation structure; and a second interconnect structure surrounded by the second insulation structure, wherein the second interconnect structure electrically connects the gate layers and the channel structures to the second bonding pads, wherein the second insulation structure contacts the first insulation structure, wherein the second bonding pads contact the first bonding pads, respectively, and wherein the second structure is bonded to the first structure;
wherein the connection layer comprises: a third insulation structure disposed on the second structure and covering the conductive etch stop layer and the second insulation structure; an input/output via penetrating through the third insulation structure and connected to the second interconnect structure; and an input/output pad connected to the input/output via and disposed on the third insulation structure, and
wherein an interface between the second insulation structure and the third insulation structure is located at a vertical level between a top surface and a bottom surface of the conductive etch stop layer.

2. The non-volatile memory device of claim 1,
wherein the conductive etch stop layer covers a top surface of the common source line.

3. The non-volatile memory device of claim 1,
wherein the top surface of the conductive etch stop layer is disposed at a first vertical level with respect to the first substrate, the interface between the second insulation structure and the third insulation structure is disposed at a second vertical level with respect to the first substrate, and the bottom surface of the conductive etch stop layer is disposed at a third vertical level with respect to the first substrate, and
wherein a distance between the first vertical level and the second vertical level is less than a distance between the second vertical level and the third vertical level.

4. The non-volatile memory device of claim 3,
wherein the distance between the first vertical level and the second vertical level is less than or equal to about 10% of a thickness of the conductive etch stop layer.

5. The non-volatile memory device of claim 1,
wherein the conductive etch stop layer comprises a conductive material containing carbon, a metal, or a conductive metal nitride.
6. The non-volatile memory device of claim 5,
wherein the conductive etch stop layer comprises a conductive material containing about 1 atom % to about 5 atom % carbon.
7. The non-volatile memory device of claim 1,
further comprising a lower conductive layer disposed between the common source line layer and the stacked structure.
8. The non-volatile memory device of claim 7,
wherein the channel structure comprises a channel layer and a gate insulation layer disposed between the channel layer and the cell region of the stacked structure, and
wherein the lower conductive layer penetrates through the gate insulation layer and contacts the channel layer.
9. The non-volatile memory device of claim 8,
wherein the gate insulation layer is further disposed between the common source line layer and the channel layer.
10. The non-volatile memory device of claim 1,
wherein the stacked structure comprises a stepped region, which is disposed on an adjacent side of the cell region of the stacked structure and has a stepped shape,
wherein the non-volatile memory device further comprises a dummy channel structure comprising a conductive layer penetrating through the stepped region of the stacked structure and contacting the common source line layer, and an insulation layer disposed between the conductive layer and the stepped region of the stacked structure, and
wherein the common source line layer is electrically connected to the peripheral circuit through the conductive layer of the dummy channel structure, the second interconnect structure, the second bonding pads, the first bonding pads, and the first interconnect structure.
11. A non-volatile memory device comprising:
a first structure;
a second structure bonded to the first structure; and
a connection layer disposed on the second structure,
wherein the first structure comprises:
a first substrate;
a peripheral circuit disposed on the first substrate;
a first insulation structure disposed on the first substrate and the peripheral circuit;
a plurality of first bonding pads disposed on the first insulation structure; and
a first interconnect structure surrounded by the first insulation structure and electrically connecting the peripheral circuit to the first bonding pads;
wherein the second structure comprises:
a conductive etch stop layer comprising a conductive material containing carbon;
a common source line layer disposed to cover a bottom surface of the conductive etch stop layer and overlap the conductive etch stop layer in a vertical direction normal to the first substrate, and which comprises a conductive material not containing carbon;
a stacked structure comprising a plurality of gate layers and a plurality of interlayer insulation layers and disposed on the common source line layer, wherein gate layers of the plurality of gate layers are alternately stacked with interlayer insulation layers of the plurality of interlayer insulation layers;
a plurality of channel structures penetrating through a cell region of the stacked structure and contacting the common source line layer;
a word line cut structure disposed in the stacked structure and extending in a horizontal direction:
a second insulation structure disposed on the stacked structure;
a plurality of second bonding pads disposed on the second insulation structure, wherein the second bonding pads are respectively bonded to the first bonding pads; and
a second interconnect structure surrounded by the second insulation structure and electrically connecting the gate layers and the channel structures to the second bonding pads, and
wherein the connection layer comprises:
a third insulation structure covering a top surface and upper portions of side surfaces of the conductive etch stop layer and a top surface of the second insulation structure;
an input/output via penetrating through the third insulation structure and connected to the second interconnect structure; and
an input/output pad connected to the input/output via and disposed on the third insulation structure.
12. The non-volatile memory device of claim 11,
wherein an interface between the conductive etch stop layer and the third insulation structure is disposed at a first vertical level with respect to the first substrate, an interface between the second insulation structure and the third insulation structure is disposed at a second vertical level with respect to the first substrate, and an interface between the conductive etch stop layer and the common source line layer is disposed at a third vertical level with respect to the first substrate, and
wherein the second vertical level is lower than the first vertical level and higher than the third vertical level.
13. The non-volatile memory device of claim 11,
wherein the word line cut structure comprises an insulation material.
14. The non-volatile memory device of claim 11,
wherein the second structure further comprises a dummy word line cut structure penetrating through the stacked structure in the vertical direction, electrically contacting the common source line layer, and extending in the horizontal direction, and
wherein the dummy word line cut structure comprises a conductive layer electrically contacting the common source line layer, and an insulation layer disposed between the conductive layer and the stacked structure.
15. The non-volatile memory device of claim 14,
further comprising a lower conductive layer disposed between the common source line layer and the stacked structure and a lower support layer disposed between the stacked structure and the lower conductive layer,
wherein the word line cut structure and the dummy word line cut structure further penetrate through the lower support layer.
16. The non-volatile memory device of claim 11,
wherein the conductive etch stop layer comprises polysilicon containing about 1 atom % or more of carbon, and
wherein the common source line layer comprises polysilicon not containing carbon.
17. A memory system comprising:
a non-volatile memory device comprising a first structure, a second structure bonded to the first structure, and a connection layer disposed on the second structure; and a memory controller electrically connected to the non-volatile memory device and configured to control the non-volatile memory device, wherein the first structure comprises: a first substrate; a peripheral circuit disposed on the first substrate; a first insulation structure disposed on the first substrate and the peripheral circuit; a plurality of first bonding pads disposed on the first insulation structure; and a first interconnect structure surrounded by the first insulation structure and electrically connecting the peripheral circuit and the plurality of first bonding pads;

wherein the second structure comprises: a conductive etch stop layer; a common source line layer disposed on the conductive etch stop layer; a stacked structure including a plurality of gate layers and a plurality of interlayer insulation layers disposed on the common source line layer, wherein gate layers of the plurality of gate layers are alternately stacked with interlayer insulation layers of the plurality of interlayer insulation layers; a plurality of channel structures penetrating through a cell region of the stacked structure and contacting the common source line layer; a second insulation structure disposed on the stacked structure; a plurality of second bonding pads disposed of the second insulation structure; and a second interconnect structure surrounded by the second insulation structure and electrically connecting the gate layers and the channel structures to the plurality of second bonding pads, wherein the second insulation structure contacts the first insulation structure, the plurality of second bonding pads respectively contact the plurality of first bonding pads, and the second structure is bonded to the first structure, wherein the connection layer comprises a third insulation structure disposed on the second structure and covering the conductive etch stop layer and the second insulation structure; an input/output via penetrating through the third insulation structure and connected to the second interconnect structure; and an input/output pad disposed on the third insulation structure and connected to the input/output via, and wherein an interface between the second insulation structure and the third insulation structure is disposed at a vertical level between a top surface and a bottom surface of the conductive etch stop layer, and the third insulation structure covers the top surface and upper portions of side surfaces of the conductive etch stop layer and a top surface of the second insulation structure.

18. The memory system of claim 17, wherein the conductive etch stop layer has a thickness of about 1,000 Å to about 3,000 Å.

19. The memory system of claim 18, wherein the interface between the second insulation structure and the third insulation structure is disposed at a vertical level that is from about 50 Å to about 300 Å lower than the top surface of the conductive etch stop layer with respect to the first substrate.

20. The memory system of claim 17, wherein the conductive etch stop layer comprises polysilicon containing about 1 atom % to about 5 atom % of carbon.

* * * * *